(12) United States Patent
Uo

(10) Patent No.: US 8,704,565 B2
(45) Date of Patent: Apr. 22, 2014

(54) LOCK DETECTION CIRCUIT, DLL CIRCUIT, AND RECEIVING CIRCUIT

(75) Inventor: Toyoaki Uo, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,636

(22) Filed: Aug. 31, 2012

(65) Prior Publication Data

US 2013/0214835 A1  Aug. 22, 2013

(30) Foreign Application Priority Data

Feb. 21, 2012  (JP) ................ 2012-035550

(51) Int. Cl.
*H03L 7/06* (2006.01)
(52) U.S. Cl.
USPC .................. 327/158; 327/152; 327/161
(58) Field of Classification Search
None
See application file for complete search history.

(56) References Cited

U.S. PATENT DOCUMENTS

| | | | |
|---|---|---|---|
| 6,259,290 B1 | 7/2001 | Takada et al. | |
| 7,236,028 B1 * | 6/2007 | Choi | 327/158 |
| 7,282,971 B2 * | 10/2007 | Panpalia et al. | 327/149 |
| 7,301,379 B1 * | 11/2007 | Burlingame et al. | 327/158 |
| 7,321,649 B2 * | 1/2008 | Lee | 375/376 |
| 7,327,173 B2 * | 2/2008 | Kim | 327/149 |
| 8,231,561 B2 * | 7/2012 | Siegner | 602/13 |
| 8,258,831 B1 * | 9/2012 | Banai et al. | 327/155 |
| RE43,947 E * | 1/2013 | Haerle et al. | 327/158 |
| 2004/0036087 A1 | 2/2004 | Okamura | |
| 2006/0279438 A1 | 12/2006 | Kishi et al. | |
| 2007/0075886 A1 | 4/2007 | Sakura et al. | |
| 2011/0032009 A1 | 2/2011 | Iwane | |

FOREIGN PATENT DOCUMENTS

| | | |
|---|---|---|
| JP | 2000-022524 | 1/2000 |
| JP | 2006-303663 | 11/2006 |
| JP | 2007-104106 | 4/2007 |
| JP | 2011-055482 | 3/2011 |
| WO | 02/095947 | 11/2002 |

* cited by examiner

*Primary Examiner* — Tuan T Lam
(74) *Attorney, Agent, or Firm* — Patterson & Sheridan, LLP

(57) ABSTRACT

According to one embodiment, a lock detection circuit includes an initial state response circuit. The initial state response circuit is configured to output a third control signal to delay lines and cause a charge pump to stop an output of a second control signal when a pulse width modulation signal is not input, the third control signal is configured to control a delay amount to cause a delay amount of an entire delay circuit to be within one selected from a range in which an OVER signal generation circuit is operable, a range in which an UNDER signal generation circuit is operable, and a range that is greater than an UNDER threshold and less than an OVER threshold.

18 Claims, 12 Drawing Sheets

| DELAY AMOUNT ΔT (×2T_s) | STATE OF MULTI-PHASE CLOCK SIGNALS ||||||||||||| 
| | φ_3 | φ_4 | φ_5 | φ_6 | φ_7 | φ_8 | φ_9 | φ_10 | φ_11 | φ_12 | φ_13 | φ_14 | φ_15 | φ_16 |
| --- | --- | --- | --- | --- | --- | --- | --- | --- | --- | --- | --- | --- | --- | --- |
| 0.0000 | L/H | L/H | L/H | L/H | L/H | L/H | L/H | L/H | L/H | L/H | L/H | L/H | L/H | L/H |
| 0.5714 | L | L | L | L | L | L | L | L | L | L | L | L | L | L/H |
| 0.6154 | L | L | L | L | L | L | L | L | L | L | L | L | L/H | H |
| 0.6667 | L | L | L | L | L | L | L | L | L | L | L | L/H | H | H |
| 0.7273 | L | L | L | L | L | L | L | L | L | L | L/H | H | H | H |
| 0.8000 | L | L | L | L | L | L | L | L | L | L/H | H | H | H | H |
| 0.8889 | L | L | L | L | L | L | L | L | L/H | H | H | H | H | H |
| 1.0000 | L | L | L | L | L | L | L | L/H | H | H | H | H | H | H |
| 1.1429 | L | L | L | L | L | L | L/H | H | H | H | H | H | H | L/H |
| 1.2308 | L | L | L | L | L | L | H | H | H | H | H | H | L/H | L |
| 1.3333 | L | L | L | L | L | L/H | H | H | H | H | H | L/H | L | L |
| 1.4545 | L | L | L | L | L | H | H | H | H | H | L/H | L | L | L |
| 1.6000 | L | L | L | L | L/H | H | H | H | H | L/H | L | L | L | L |
| 1.7143 | L | L | L | L | H | H | H | H | H | L | L | L | L | L/H |
| 1.7778 | L | L | L | L | H | H | H | H | L/H | L | L | L | L | H |
| 1.8462 | L | L | L | L | H | H | H | H | L | L | L | L | L/H | H |
| 2.0000 | L | L | L | L/H | H | H | H | L/H | L | L | L | L/H | H | H |
| 2.1818 | L | L | L | H | H | H | H | L | L | L | L/H | H | H | H |
| 2.2857 | L | L | L | H | H | H | L/H | L | L | L | H | H | H | L/H |
| 2.4000 | L | L | L | H | H | H | L | L | L | L/H | H | H | H | L |
| 2.4615 | L | L | L | H | H | H | L | L | L | H | H | H | L/H | L |
| 2.6667 | L | L | L/H | H | H | L/H | L | L | L/H | H | H | L/H | L | L |
| 2.8571 | L | L | H | H | H | L | L | L | H | H | H | L | L | L/H |
| 2.9091 | L | L | H | H | H | L | L | L | H | H | L/H | L | L | H |
| 3.0000 | L | L | H | H | H | L | L | L/H | H | H | L | L | L | H |
| 3.0769 | L | L | H | H | H | L | L | H | H | H | L | L | L/H | H |
| 3.2000 | L | L | H | H | L/H | L | L | H | H | L/H | L | L | H | H |
| 3.3333 | L | L | H | H | L | L | L | H | H | L | L | L/H | H | H |
| 3.4286 | L | L | H | H | L | L | L/H | H | H | L | L | H | H | L/H |
| 3.5556 | L | L | H | H | L | L | H | H | L/H | L | L | H | H | L |
| 3.6364 | L | L | H | H | L | L | H | H | L | L | L/H | H | H | L |
| 3.6923 | L | L | H | H | L | L | H | H | L | L | H | H | L/H | L |
| 4.0000 | L | L/H | H | L/H | L | L/H | H | L/H | L | L | H | L/H | L | L/H |
| 4.3077 | L | H | H | L | L | H | H | L | L | L | H | H | L/H | H |
| 4.3636 | L | H | H | L | L | H | H | L | L | H | L/H | L | H | H |
| 4.4444 | L | H | H | L | L | H | H | L | L/H | H | L | L | H | H |
| 4.5714 | L | H | H | L | L | H | L/H | L | H | H | L | L | H | L/H |
| 4.6667 | L | H | H | L | L | H | L | L | H | H | L | L/H | H | L |
| 4.8000 | L | H | H | L | L/H | H | L | L | H | L/H | L | H | H | L |
| 4.9231 | L | H | H | L | H | H | L | L | H | L | L | H | L/H | L |
| 5.0000 | L | H | H | L | H | H | L | L/H | H | L | L | H | L | L |
| 5.0909 | L | H | H | L | H | H | L | H | H | L | L/H | H | L | L |
| 5.1429 | L | H | H | L | H | H | L | H | H | L | H | H | L | L/H |
| 5.3333 | L | H | L/H | L | H | L/H | L | H | L/H | L | H | L/H | L | H |
| 5.5385 | L | H | L | L | H | L | H | H | L | L | H | L | L | H |
| 5.6000 | L | H | L | L | H | L | H | H | L | L/H | H | L | L | H |
| 5.7143 | L | H | L | L | H | L | L/H | H | L | H | H | L | L | L/H |
| 5.8182 | L | H | L | L | H | L | L | H | L | H | L/H | L | L | L |
| 6.0000 | L | H | L | L/H | H | L | L | L/H | L | H | L | L/H | L | L |
| 6.1538 | L | H | L | H | H | L | L | L | L | H | L | H | L/H | L |

FIG. 9

| VCDL CONTROL SIGNAL | | $V_{CTR}$ | $V_{INT*}$ (SET SIGNAL OF D-F/F) | STATE |
|---|---|---|---|---|
| UNDER | OVER | | | |
| L | L | L | H | LOCKED STATE |
| L | L | H | L | NO-SIGNAL STATE |
| L | H | L | H | OVER STATE |
| L | H | H | L | NO-SIGNAL STATE |
| H | L | L | H | UNDER STATE |
| H | L | H | L | NO-SIGNAL STATE |
| H | H | L | L | UNSTABLE LOCK DETECTION |
| H | H | H | L | NO-SIGNAL STATE |

FIG. 11

LOCK DETECTION CIRCUIT, DLL CIRCUIT, AND RECEIVING CIRCUIT

CROSS-REFERENCE TO RELATED APPLICATIONS

This application is based upon and claims the benefit of priority from the prior Japanese Patent Application No. 2012-035550, filed on Feb. 21, 2012; the entire contents of which are incorporated herein by reference.

FIELD

Embodiments described herein relate generally to a lock detection circuit, a DLL (Delay Locked Loop) circuit and a receiving circuit.

BACKGROUND

A receiving circuit of a signal transfer device such as a photocoupler, a magnetically-coupled transmitter of a digital isolator, an electric field coupled transmitting circuit of a capacitor, and etc, reproduces an original signal and a clock signal from an input modulated signal. A signal modulation method that uses a PWM (Pulse Width Modulation) signal is one of various modulation methods of signals. A PWM signal is a signal in which digital data that has undergone pulse width modulation is superimposed onto a clock signal. Then, a receiving circuit of the PWM method generates the output by separating the clock signal and the digital data from the input signal. Therefore, the receiving circuit includes a delay locked loop (DLL) circuit and a demodulation circuit. The DLL circuit detects the clock signal from the input signal and generates multi-phase clock signals that are delayed by a prescribed phase from the clock signal. The demodulation circuit reads the pulse width synchronously with the multi-phase clock signals and reproduces the digital data from this pulse width.

The DLL circuit generates a reference clock signal and the multi-phase clock signals based on the input signal at the same moment. Each of the multi-phase clock signals is delayed from the reference clock signal by a prescribed amount of time. The DLL circuit compares the phase of the multi-phase clock signal that is delayed by one clock and the phase of the reference clock signal that is delayed by one clock. And, The DLL circuit synchronizes the multi-phase clock signals with a reference clock signal by controlling the delay amount of the multi-phase clock signals based on this comparison result. However, such a DLL circuit is problematic in that stable operations are difficult in the initial state in which the input signal is not input.

BRIEF DESCRIPTION OF THE DRAWINGS

FIG. 9 is a table illustrating the relationship between the delay amount $\Delta T$ and the values of the latched signals;

FIG. 11 is a truth table of the initial state control circuit illustrated in FIG. 4.

DETAILED DESCRIPTION

Figure 1:
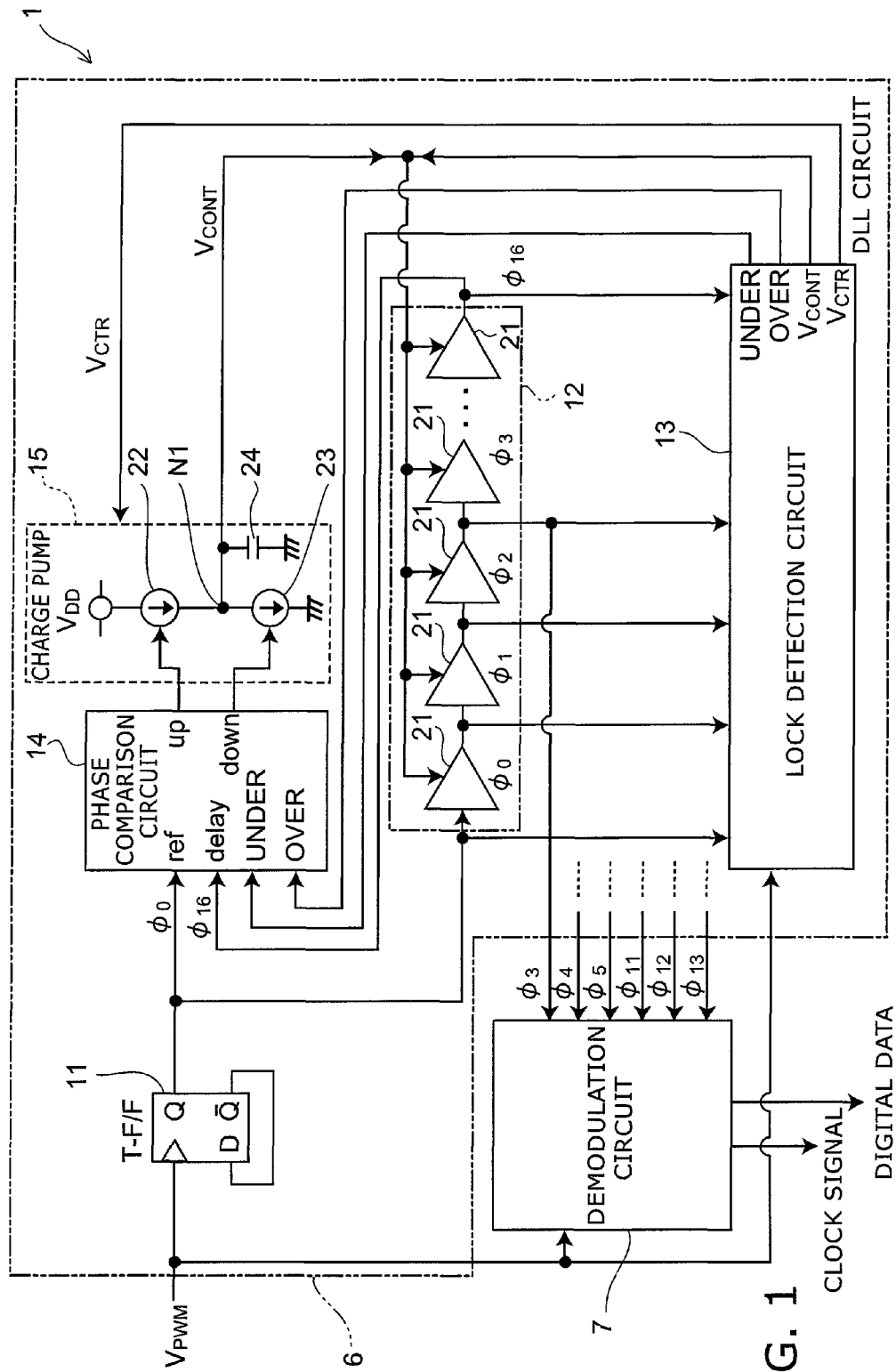
FIG. 1 is a block diagram illustrating a receiving circuit according to an embodiment.

In general, a lock detection circuit according to one embodiment is mounted in a DLL circuit. The DLL circuit includes a reference clock signal generation circuit, a delay circuit, a phase comparison circuit and a charge pump. The reference clock signal generation circuit is configured to generate a reference clock signal from a pulse width modulation signal generated by pulse width modulation of digital data. A period of the reference clock signal is twice a period of the pulse width modulation signal. A phase of the reference clock signal is equal to a phase of the pulse width modulation signal. The delay circuit includes a delay line configured to output an input signal after delaying the input signal by a prescribed delay amount. A plurality of stages of the delay lines are connected in series. The reference clock signal is input to the delay line of a first stage. The phase comparison circuit is configured to output a first control signal. The reference clock signal and an output signal of the delay line of a final stage are input to the phase comparison circuit. The charge pump is configured to output a second control signal to the delay lines to control the delay amount based on the first control signal. The phase comparison circuit is configured to output the first control signal to reduce the delay amount when an OVER signal is input, output the first control signal to increase the delay amount when an UNDER signal is input, and output the first control signal to match a phase of the output signal of the delay line of the final stage to the phase of the reference clock signal when the OVER signal and the UNDER signal are not input. The DLL circuit is configured to output at least a portion of the output signals of the delay lines. The lock detection circuit includes an OVER signal generation circuit, an UNDER signal generation circuit and an initial state response circuit. The OVER signal generation circuit is configured to determine whether or not a delay amount of the entire delay circuit is not less than an OVER threshold based on the output signals of the delay lines and send the OVER signal when the delay amount of the entire delay circuit is not less than the OVER threshold. The UNDER signal generation circuit is configured to determine whether or not the delay amount of the entire delay circuit is not more than an UNDER threshold based on the output signals of the delay lines and send the UNDER signal when the delay amount of the entire delay circuit is not more than the UNDER threshold. The initial state response circuit is configured to output a third control signal to the delay lines and cause the charge pump to stop the output of the second control signal when the pulse width modulation signal is not input. The third control signal is configured to control the delay amount to cause the delay amount of the entire delay circuit to be within one selected from a range in which the OVER signal generation circuit is operable, a range in which the UNDER signal generation circuit is operable, and a range that is greater than the UNDER threshold and less than the OVER threshold.

A DLL circuit according to one embodiment includes a reference clock signal generation circuit, a delay circuit, a phase comparison circuit, a charge pump and a lock detection circuit. The reference clock signal generation circuit is configured to generate a reference clock signal from a pulse width modulation signal generated by pulse width modulation of digital data A period of the reference clock signal is twice a period of the pulse width modulation signal. A phase of the reference clock signal is equal to a phase of the pulse width modulation signal. The delay circuit includes a delay line configured to output an input signal after delaying the input signal by a prescribed delay amount. A plurality of stages of the delay lines are connected in series. The reference clock signal is input to the delay line of a first stage. The phase comparison circuit is configured to output a first control signal. The reference clock signal and an output signal of the delay line of a final stage are input to the phase comparison circuit. The charge pump is configured to output a second control signal to the delay lines to control the delay amount based on the first control signal. The pulse width modulation signal and the output signals of the delay lines are input to the lock detection circuit. The lock detection circuit includes an OVER signal generation circuit, an UNDER signal generation circuit and an initial state response circuit. The OVER signal generation circuit is configured to determine whether or not a delay amount of the entire delay circuit is not less than an OVER threshold based on the output signals of the delay lines and send the OVER signal when the delay amount of the entire delay circuit is not less than the OVER threshold. The UNDER signal generation circuit is configured to determine whether or not the delay amount of the entire delay circuit is not more than an UNDER threshold based on the output signals of the delay lines and send the UNDER signal when the delay amount of the entire delay circuit is not more than the UNDER threshold. The initial state response circuit is configured to output a third control signal to the delay lines and cause the charge pump to stop the output of the second control signal when the pulse width modulation signal is not input. The third control signal is configured to control the delay amount to cause the delay amount of the entire delay circuit to be within one selected from a range in which the OVER signal generation circuit is operable, a range in which the UNDER signal generation circuit is operable, and a range that is greater than the UNDER threshold and less than the OVER threshold. The phase comparison circuit is configured to output the first control signal to reduce the delay amount when the OVER signal is input, output the first control signal to increase the delay amount when the UNDER signal is input, and output the first control signal to match a phase of the output signal of the delay line of the final stage to the phase of the reference clock signal when the OVER signal and the UNDER signal are not input. The DLL circuit is configured to output at least a portion of the output signals of the delay lines.

A receiving circuit according to one embodiment includes the DLL circuit and a demodulation circuit. The demodulation circuit is configured to reproduce the digital data by reading a value of the pulse width modulation signal synchronously with the at least a portion of the output signals of the delay lines.

An embodiment of the invention will now be described with reference to the drawings.

FIG. 1 is a block diagram illustrating a receiving circuit according to the embodiment.

Figure 2:
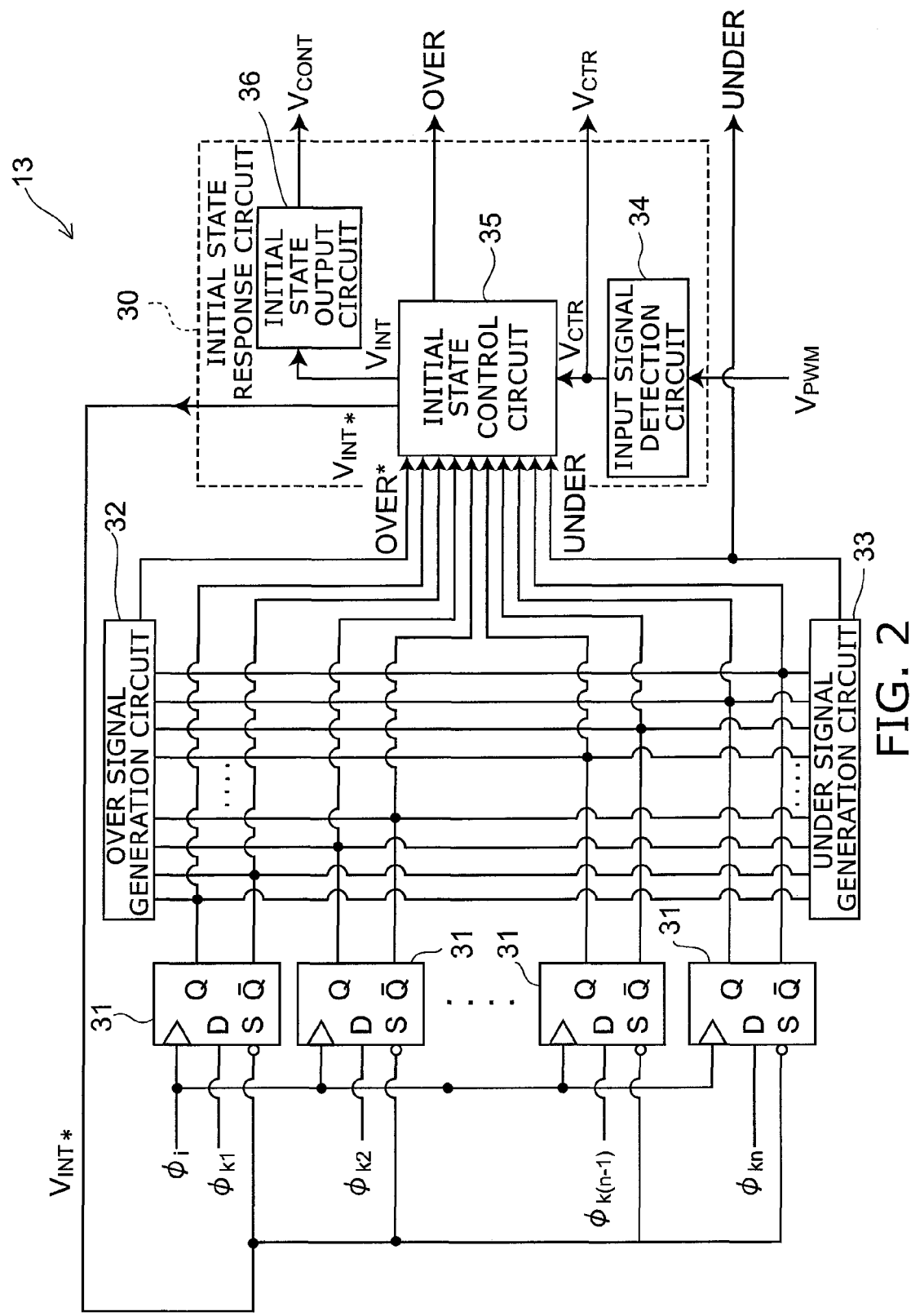
FIG. 2 is a block diagram illustrating a lock detection circuit according to the embodiment.

FIG. 2 is a block diagram illustrating a lock detection circuit according to the embodiment.

Figure 3:
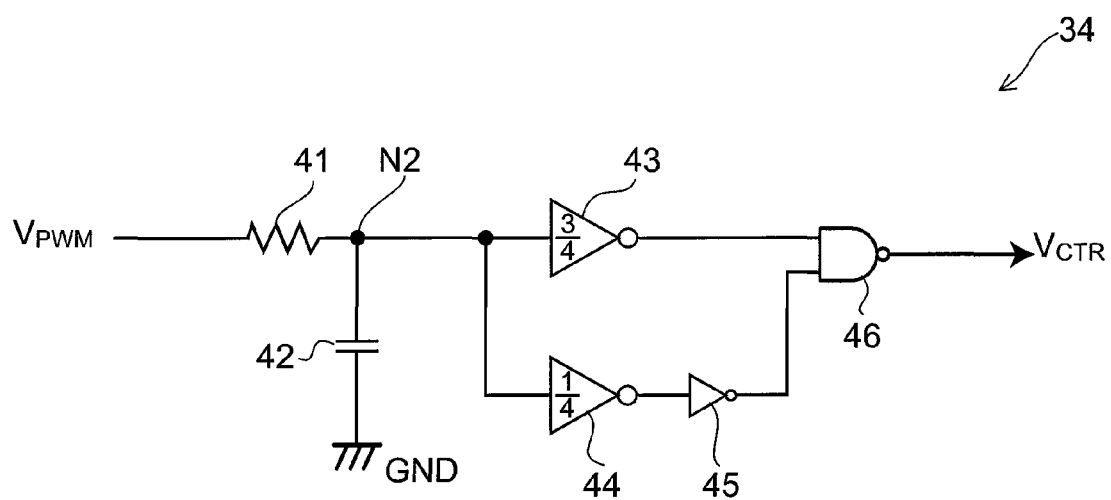
FIG. 3 is a circuit diagram illustrating an input signal detection circuit of the embodiment.

FIG. 3 is a circuit diagram illustrating an input signal detection circuit of the embodiment.

Figure 4:
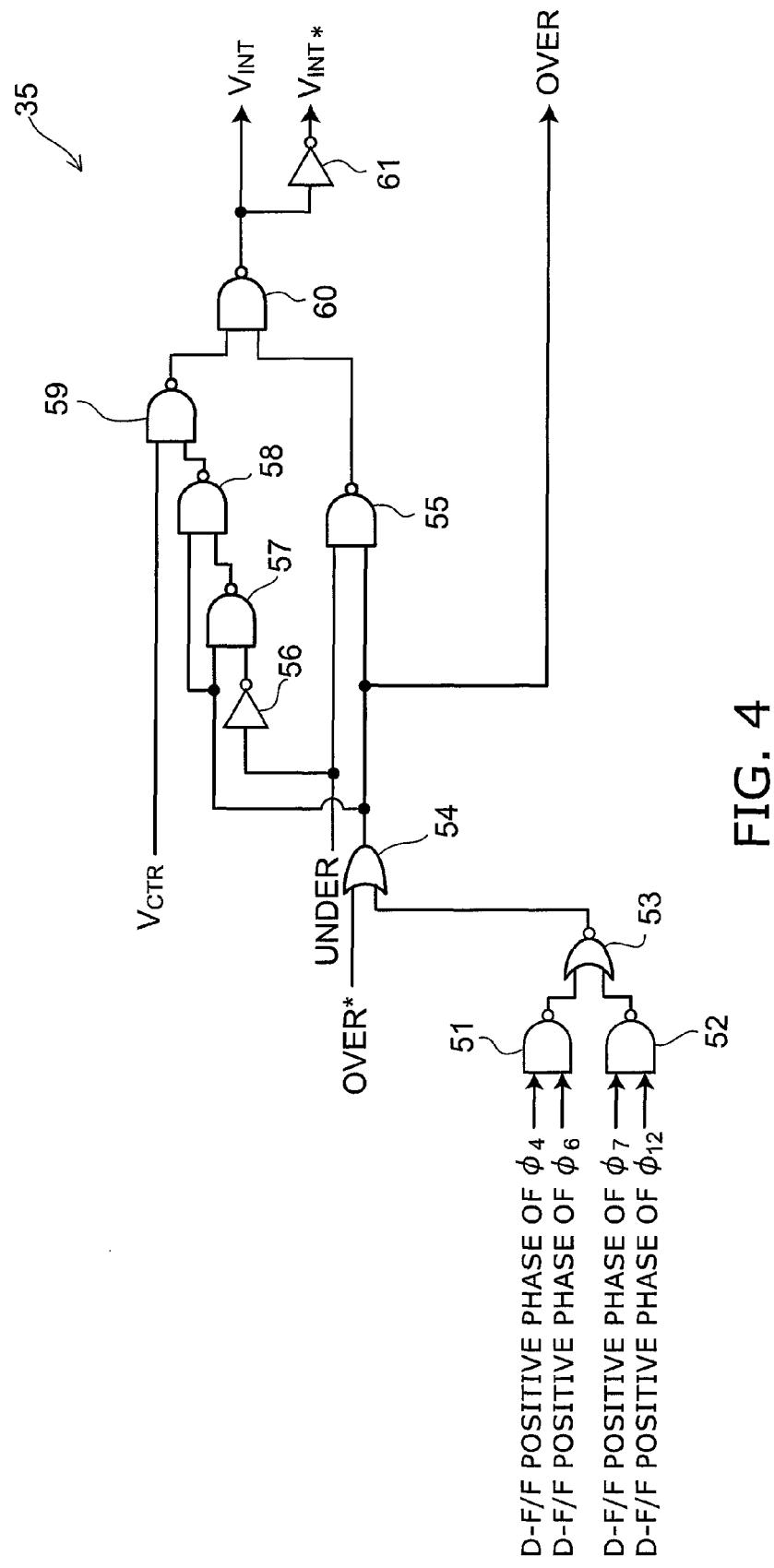
FIG. 4 is a circuit diagram illustrating an initial state control circuit of the embodiment.

FIG. 4 is a circuit diagram illustrating an initial state control circuit of the embodiment.

Figure 5:
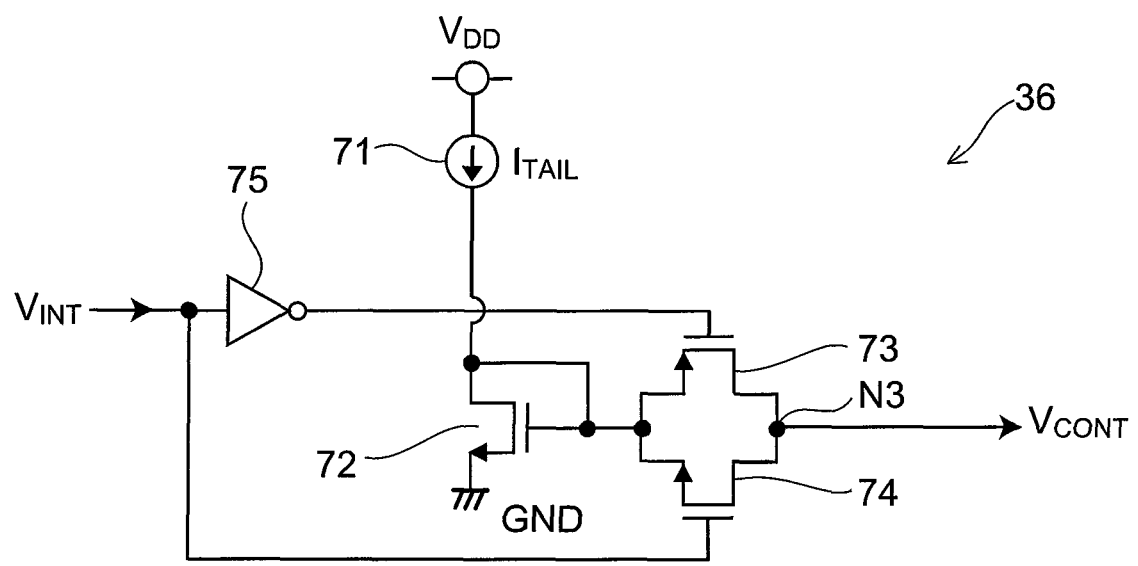
FIG. 5 is a circuit diagram illustrating an initial state output circuit of the embodiment.

FIG. 5 is a circuit diagram illustrating an initial state output circuit of the embodiment.

For example, the receiving circuit according to the embodiment is a photocoupler receiving circuit.

As illustrated in FIG. 1, the receiving circuit 1 according to the embodiment receives the input of a pulse width modulation (PWM) signal $V_{PWM}$ for which the rise timing is synchronous with the clock signal and the pulse width is determined according to the digital data of the original signal, separates the input signal into the clock signal and the digital data, and outputs the clock signal and the digital data In other words, the pulse width modulation signal $V_{PWM}$ includes the original signal and the information about synchronization. Hereinbelow, the pulse width modulation signal $V_{PWM}$ also is referred to as the "$V_{PWM}$ signal". Other signals also are referred to similarly.

Information of a prescribed bit count per cycle is included in the $V_{PWM}$ signal; and this information is written as a duty ratio, i.e., a difference of pulse widths. For example, in the case of a pulse width modulation in which 1.5 bits of information are included per cycle, the $V_{PWM}$ signal has three types of pulse widths having duty ratios of 25%, 50%, and 75%. Therefore, the microscopic duty ratio of the $V_{PWM}$ signal reflects the content of the digital data prior to the modulation. On the other hand, the macroscopic duty ratio of the $V_{PWM}$ signal depends on the properties of the digital data prior to the modulation and the setting of the pulse width and normally can be statistically within a prescribed range.

A delay locked loop circuit (a DLL circuit) 6 and a demodulation circuit 7 are provided in the receiving circuit 1. The $V_{PWM}$ signal is input to the DLL circuit 6; and a reference clock signal $\phi_0$ is extracted from the $V_{PWM}$ signal. The reference clock signal $\phi_0$ is generated by a T-type flip-flop 11; and because the period of the $V_{PWM}$ signal is $T_S$, the reference clock signal $\phi_0$ has a period of $2T_S$ and a pulse duty ratio of 50%. The DLL circuit 6 generates multiple multi-phase clock signals $\phi_1$ to $\phi_N$ from the reference clock signal $\phi_0$, where the multiple multi-phase clock signals $\phi_1$ to $\phi_N$ are delayed by a prescribed phase; and the DLL circuit 6 outputs a portion of the multiple multi-phase clock signals $\phi_1$ to $\phi_N$ to the demodulation circuit 7. The demodulation circuit 7 receives the input of the $V_{PWM}$ signal and multi-phase clock signals $\phi_i$ (i being an integer of 1 to N) that are output from the DLL circuit 6, reads the pulse width of the $V_{PWM}$ signal synchronously with the multi-phase clock signals $\phi_i$, reproduces the digital data from this pulse width, and outputs the clock signal and the digital data The demodulation circuit 7 includes a logic circuit.

In the example illustrated in FIG. 1, the digital data included in the $V_{PWM}$ signal is a 1.5 bit signal; and N is 16. In other words, the DLL circuit 6 generates the reference clock signal $\phi_0$ and generates the multi-phase clock signals $\phi_1$ to $\phi_{16}$ having 16 phases based on the reference clock signal $\phi_0$. In the case where the operation of the DLL circuit 6 has normal convergence, the phases of the multi-phase clock signals are different by $(2T_S/16)$ each. Among the multi-phase clock signals $\phi_1$ to $\phi_{16}$, the DLL circuit 6 outputs the multi-phase clock signals $\phi_3$, $\phi_4$, $\phi_5$, $\phi_{11}$, $\phi_{12}$, and $\phi_{13}$ to the demodulation circuit 7. The reasons and the specific methods thereof are described below.

The DLL circuit 6 includes the T-type flip-flop 11 which is used as the reference clock signal generation circuit, a delay circuit 12, a lock detection circuit 13, a phase comparison circuit 14, and a charge pump 15. Among these, the $V_{PWM}$ signal is input to the T-type flip-flop 11, the lock detection circuit 13, and the demodulation circuit 7.

The reference clock signal $\phi_0$ is output from the Q terminal of the T-type flip-flop 11. The Q terminal of the T-type flip-flop 11 is connected to the delay circuit 12, the lock detection circuit 13, and the phase comparison circuit 14.

N stages, e.g., 16 stages, of voltage-controlled delay lines (VCDLs) 21 are provided in the delay circuit 12 and connected in series. Each of the VCDLs 21 includes, for example, a MOSFET (Metal-Oxide-Semiconductor Field-Effect Transistor) and/or a capacitance element. Each of the VCDLs 21 generates an output by delaying the signal that is input by a prescribed amount of time (a delay amount) $\Delta t$. The delay amount $\Delta t$ per stage of the VCDLs 21 is controlled by a control signal. $V_{CONT}$ which is output from the charge pump 15 such that a delay amount $\Delta T$ of the entire delay circuit 12 is controlled to converge to $2T_S$.

The VCDL 21 of the first stage receives the input of the $\phi_0$ signal from the Q terminal of the T-type flip-flop 11 and outputs the $\phi_1$ signal which is delayed by $2T_S/N$. The VCDL 21 of the second stage receives the input of the $\phi_1$ signal and outputs the $\phi_2$ signal which is delayed by $2T_S/N$. Similarly, the VCDL 21 of the ith stage receives the input of the $\phi_{(i-1)}$ signal and outputs the $\phi_i$ signal which is delayed by $2T_S/N$. The VCDL 21 of the Nth stage outputs the $\phi_N$ signal. The phase difference of the $\phi_0$ signal and the $\phi_N$ signal is detected in the phase comparison circuit 14; and the charge pump 15 is controlled to eliminate the phase difference. Accordingly, in the state in which the operation of the DLL circuit 6 converges, the delay amount $\Delta T$ of the entire delay circuit 12 is $2T_S$. The output terminal of each of the VCDLs 21 is connected to the lock detection circuit 13. A portion of the output terminals of the VCDLs 21 also is connected to the demodulation circuit 7.

The $V_{PWM}$ signal and the $\phi_0$ to $\phi_N$ signals are input to the lock detection circuit 13. The lock detection circuit 13 performs the determination in the phase state in which the phase comparison circuit 14 cannot perform the determination, that is, in the case where the phase difference between the $\phi_0$ signal and the $\phi_N$ signal is a half period of the $\phi_0$ signal or greater. An UNDER signal is output when the delay amount $\Delta T$ is less than a prescribed value (an UNDER threshold); and an OVER signal is output when the delay amount $\Delta T$ is greater than a prescribed value (an OVER threshold). The UNDER signal and the OVER signal are output to the phase comparison circuit 14. In the case where the UNDER signal or the OVER signal is input to the phase comparison circuit 14, the charge pump 15 is controlled regardless of the phase difference between the $\phi_0$ signal and the $\phi_N$ signal. When the $V_{PWM}$ signal is not input, the lock detection circuit 13 determines this to be the initial state, outputs a control signal $V_{CTR}$ to the charge pump 15, and forcibly sets the delay time of each of the VCDLs 21 of the delay circuit 12 by outputting the control signal $V_{CONT}$ to each of the VCDLs 21. The configuration of the lock detection circuit 13 is described below.

The phase comparison circuit 14 receives the inputs of the $\phi_0$ signal from the T-type flip-flop 11, the $\phi_N$ signal from the delay circuit 12, and the UNDER signal and the OVER signal from the lock detection circuit 13. The phase comparison circuit 14 outputs an up signal and a down signal which are digital voltage signals to the charge pump 15. The up signal and the down signal are the first control signal. The phase comparison circuit 14 compares the phase of the $\phi_0$ signal and the phase of the $\phi_N$ signal and controls the up signal and the down signal such that the phase difference between the $\phi_0$ signal and the $\phi_N$ signal becomes zero. For example, in the case where the phase of the $\phi_N$ signal is delayed more than the phase of the $\phi_0$ signal, an output period of the up signal is longer than an output period of the down signal. On the other hand, in the case where the phase of the $\phi_N$ signal is ahead of the phase of the $\phi_0$ signal, the output period of the down signal is longer than the output period of the up signal. In the case where the OVER signal or the UNDER signal is input, the up signal and the down signal are output regardless of the phase difference between the $\phi_0$ signal and the $\phi_N$ signal. For example, in the case where the OVER signal is input, the up signal is output; and in the case where the UNDER signal is input, the down signal is output. The phase comparison circuit 14 includes a logic circuit.

A power supply potential $V_{DD}$ and a grounding potential GND are supplied to the charge pump 15; and direct-current sources 22 and 23 are connected in series between the power supply potential $V_{DD}$ and the grounding potential GND. Herein, the current values of the direct-current source 22 and the direct-current source 23 are taken to be substantially equal. The up signal is input to the direct-current source 22 which is connected to the power supply potential $V_{DD}$; and the direct-current source 22 operates when the up signal is input. The down signal can be input to the direct-current source 23 which is connected to the grounding potential GND; and the direct-current source 23 operates when the down signal is input. A connection point N1 between the direct-current source 22 and the direct-current source 23 is connected to a capacitor 24, each of the VCDLs 21 of the delay circuit 12, and the lock detection circuit 13.

In the case where the up signal is output, the direct-current source 22 operates, a charge is stored in the capacitor 24, and the potential of the control signal $V_{CONT}$ increases. On the other hand, in the case where the down signal is output, the direct-current source 23 operates, the charge is removed from the capacitor 24, and the potential of the control signal $V_{CONT}$ decreases. In the case where the up signal and the down signal are simultaneously output and in the case where neither the up signal nor the down signal is output, the potential of the control signal $V_{CONT}$ remains at a constant value. The $V_{CTR}$ signal can be input from the lock detection circuit 13 to the charge pump 15; and when the $V_{CTR}$ signal is input, the direct-current sources 22 and 23 are stopped; and the $V_{CONT}$ signal is output by the lock detection circuit 13.

The configuration of the lock detection circuit 13 will now be described.

As illustrated in FIG. 2, n edge-triggered D-type flip-flops 31 (n being an integer not less than 1) having set terminals are provided in the lock detection circuit 13. An OVER signal generation circuit 32, an UNDER signal generation circuit 33, an input signal detection circuit 34, an initial state control circuit 35, and an initial state output circuit 36 are provided in the lock detection circuit 13. Except for the input signal detection circuit 34, these circuits may include logic circuits. The input signal detection circuit 34, the initial state control circuit 35, and the initial state output circuit 36 are included in an initial state response circuit 30.

The output terminal of one of the VCDLs 21 is connected to the clock terminals of the D-type flip-flops 31 to input a multi-phase clock signal $\phi_i$. The output terminals of mutually different VCDLs 21 are connected respectively to the D terminals of the D-type flip-flops 31; and n types of multi-phase clock signals $\phi_{k1}, \phi_{k2}, \ldots, \phi_{k(n-1)}$, and $\phi_{kn}$ that are selected from the multi-phase clock signals $\phi_1$ to $\phi_N$ are input respectively. However, the multi-phase clock signals $\phi_{k1}, \phi_{k2}, \ldots, \phi_{k(n-1)}$, and $\phi_{kn}$ that are input to the. D terminals are signals that are different from the multi-phase clock signal $\phi_i$ that is input to the clock terminal. An initial state signal $V_{INT*}$ from the initial state control circuit 35 is input to the set terminal of each of the D-type flip-flops 31. Each of the D-type flip-flops 31 latches the value of the signal input to the D terminal synchronously with the rise of the $\phi_i$ signal input to the clock terminal and provides outputs from the Q terminal and the inverted Q terminal. The output terminal and the inverted Q terminal of each of the D-type flip-flops 31 are connected to the OVER signal generation circuit 32, the UNDER signal generation circuit 33, and the initial state control circuit 35.

The OVER signal generation circuit 32 receives the inputs of the signals that are latched in the D-type flip-flops 31 and determines whether or not the delay amount $\Delta T$ of the $\phi_N$ signal with respect to the $\phi_0$ signal is not less than the OVER threshold based on these signals; and in the case where the delay amount $\Delta T$ is not less than the OVER threshold, the OVER signal generation circuit 32 outputs the OVER* signal to the initial state control circuit 35. The OVER threshold is a value that is greater than $2T_S$ which is the normal convergence value and not more than $3T_S$ which is the phase difference that cannot be detected by the phase comparison circuit 14. In the embodiment, a margin is provided in the OVER threshold by the OVER threshold being, for example, $16/13 \times 2T_S$.

The UNDER signal generation circuit 33 receives the inputs of the signals that are latched in the D-type flip-flops 31 and determines whether or not the delay amount $\Delta T$ of the $\phi_N$ signal with respect to the $\phi_0$ signal is not more than the UNDER threshold based on these signals; and in the case where the delay amount is not more than the UNDER threshold, the UNDER signal generation circuit 33 outputs the UNDER signal to the phase comparison circuit 14. The UNDER threshold is a value greater than $T_S$ which is the phase difference that cannot be detected by the phase comparison circuit 14 and less than $2T_S$ which is the normal convergence value. In the embodiment, a margin is provided in the UNDER threshold by the UNDER threshold being, for example, $4/5 \times 2T_S$. As described below, the OVER signal generation circuit 32 and the UNDER signal generation circuit 33 may include logic circuits having input terminals that are connected to the Q terminals of the multiple D-type flip-flops 31.

The input signal detection circuit 34 can receive the input of the $V_{PWM}$ signal and determines the input/non-input of the $V_{PWM}$ signal; and when the input signal detection circuit 34 determines that the $V_{PWM}$ signal is not input, the input signal detection circuit 34 outputs an H level no-input signal $V_{CTR}$ to the initial state control circuit 35 and the charge pump 15 (referring to FIG. 1).

As illustrated in FIG. 3, a resistance 41, a capacitor 42, an upper limit inverter 43, a lower limit inverter 44, an inverter 45, and a NAND circuit 46 are provided in the input signal detection circuit 34. The $V_{PWM}$ signal can be input to one end of the resistance 41. The capacitor 42 is connected between the other end of the resistance 41 and the grounding potential GND. The upper limit inverter 43 is an inverter in which the threshold between the L level and the H level is displaced to the H level side; and the lower limit inverter 44 is an inverter in which the threshold is displaced to the L level side. From the statistical properties of the $V_{PWM}$ signal, it is assumed that the average duty ratio of the $V_{PWM}$ signal is within a constant range; the upper limit of this range is used as the threshold of the upper limit inverter 43; and the lower limit is used as the threshold of the lower limit inverter 44. For example, the threshold of the upper limit inverter 43 is $\frac{3}{4}V_{DD}$ and the threshold of the lower limit inverter 44 is $\frac{1}{4}V_{DD}$ in the case where the L level is the grounding potential GND, the H level is the power supply potential $V_{DD}$, and the average duty ratio of the $V_{PWM}$ signal is 50%.

For example, the upper limit inverter 43 and the lower limit inverter 44 may be formed by combining a p-type MOSFET (pMOS) and an n-type MOSFET (nMOS) that have different surface areas. The input terminals of the upper limit inverter 43 and the lower limit inverter 44 are connected to a connection point N2 between the resistance 41 and the capacitor 42. The input terminal of the inverter 45 is connected to the output terminal of the lower limit inverter 44. The output terminal of the upper limit inverter 43 and the output terminal of the inverter 45 are connected to the input terminal of the NAND circuit 46; and the output signal of the NAND circuit 46 is the $V_{CTR}$ signal.

As illustrated in FIG. 2, the initial state control circuit 35 can receive the inputs of the output signals of the D-type flip-flops 31, the OVER* signal from the OVER signal generation circuit 32, the UNDER signal from the UNDER signal generation circuit 33, and the $V_{CTR}$ signal from the input signal detection circuit 34. Then, in the case where the initial state control circuit 35 receives the inputs of the OVER* signal from the OVER signal generation circuit 32 or the H level $V_{CTR}$ signal (in the case where the $V_{PWM}$ signal is not input), the initial state control circuit 35 outputs the OVER signal to the phase comparison circuit 14 (referring to FIG. 1). When the initial state control circuit 35 receives the input of the H level $V_{CTR}$ signal, the initial state control circuit 35 outputs an H level initial state signal $V_{INT}$ to the initial state output circuit 36 and outputs the L level initial state signal $V_{INT*}$ to the set terminals of the D-type flip-flops 31.

FIG. 4 illustrates the configuration of the initial state control circuit 35 in the case where the delay circuit 12 includes 16 stages of VCDLs 21. As illustrated in FIG. 4, NAND circuits 51 and 52, a NOR circuit 53, an OR circuit 54, a NAND circuit 55, an inverter 56, NAND circuits 57 to 60, and an inverter 61 are provided in the initial state control circuit 35. The Q terminals of mutually different D-type flip-flops 31 are connected to the input terminals of the NAND circuits 51 and 52. These D-type flip-flops 31 are combined such that the Q outputs are not simultaneously the H level for any amount of the delay amount $\Delta T$ of the $\phi_N$ signal with respect to the $\phi_0$ signal.

The output terminals of the NAND circuits 51 and 52 are connected to the input terminals of the NOR circuit 53. The output terminal of the NOR circuit 53 is connected to an input terminal of the OR circuit 54; and the OVER* signal can be input to the OR circuit 54. The output terminal of the OR circuit 54 is connected to an input terminal of the NAND circuit 55; and the UNDER signal can be input to the NAND circuit 55. The UNDER signal can be input to the input terminal of the inverter 56. The output terminal of the inverter 56 and the output terminal of the OR circuit 54 are connected to the input terminals of the NAND circuit 57. The output terminal of the NAND circuit 57 and the output terminal of the OR circuit 54 are connected to the input terminals of the NAND circuit 58. The output terminal of the NAND circuit 58 is connected to the input terminal of the NAND circuit 59; and the $V_{CTR}$ signal can be input to the NAND circuit 59.

The output terminal of the NAND circuit 55 and the output terminal of the NAND circuit 59 are connected to the input terminals of the NAND circuit 60. The output terminal of the NAND circuit 60 is connected to the input terminal of the inverter 61. The output terminal of the NAND circuit 60 is connected to the initial state output circuit 36 (referring to FIG. 2). The output terminal of the inverter 61 is connected to the set terminal of each of the D-type flip-flops 31 (referring to FIG. 2). Then, the output signal of the NAND circuit 60 is the $V_{INT}$ signal; and the output signal of the inverter 61 is the $V_{INT*}$ signal. The output signal of the OR circuit 54 is the OVER signal.

As illustrated in FIG. 5, a constant current source 71, an nMOS 72, a pMOS 73, an nMOS 74, and an inverter 75 are provided in the initial state output circuit 36. The anode of the constant current source 71 is connected to the power supply potential $V_{DD}$; and the cathode is connected to the drain and the gate of the nMOS 72. The source of the nMOS 72 is connected to the grounding potential GND. One selected from the source and the drain of the pMOS 73 and one selected from the source and the drain of the nMOS 74 are connected to the cathode of the constant current source 71. The $V_{INT}$ signal is applied to the input terminal of the inverter 75 and the gate of the nMOS 74. The output terminal of the inverter 75 is connected to the gate of the pMOS 73. The $V_{CONT}$ signal is output from a connection point N3 between the other selected from the source and the drain of the pMOS 73 and the other selected from the source and the drain of the nMOS 74. Thus, an analog switch is formed of the pMOS 73 and the nMOS 74. Thereby, the initial state output circuit 36 generates the analog $V_{CONT}$ signal based on the power supply potential $V_{DD}$ and the grounding potential GND and outputs the $V_{CONT}$ signal as the third control signal to each of the VCDLs 21 when the H level $V_{INT}$ signal is input from the initial state control circuit 35.

Operations of the receiving circuit according to the embodiment will now be described.

Figure 6:
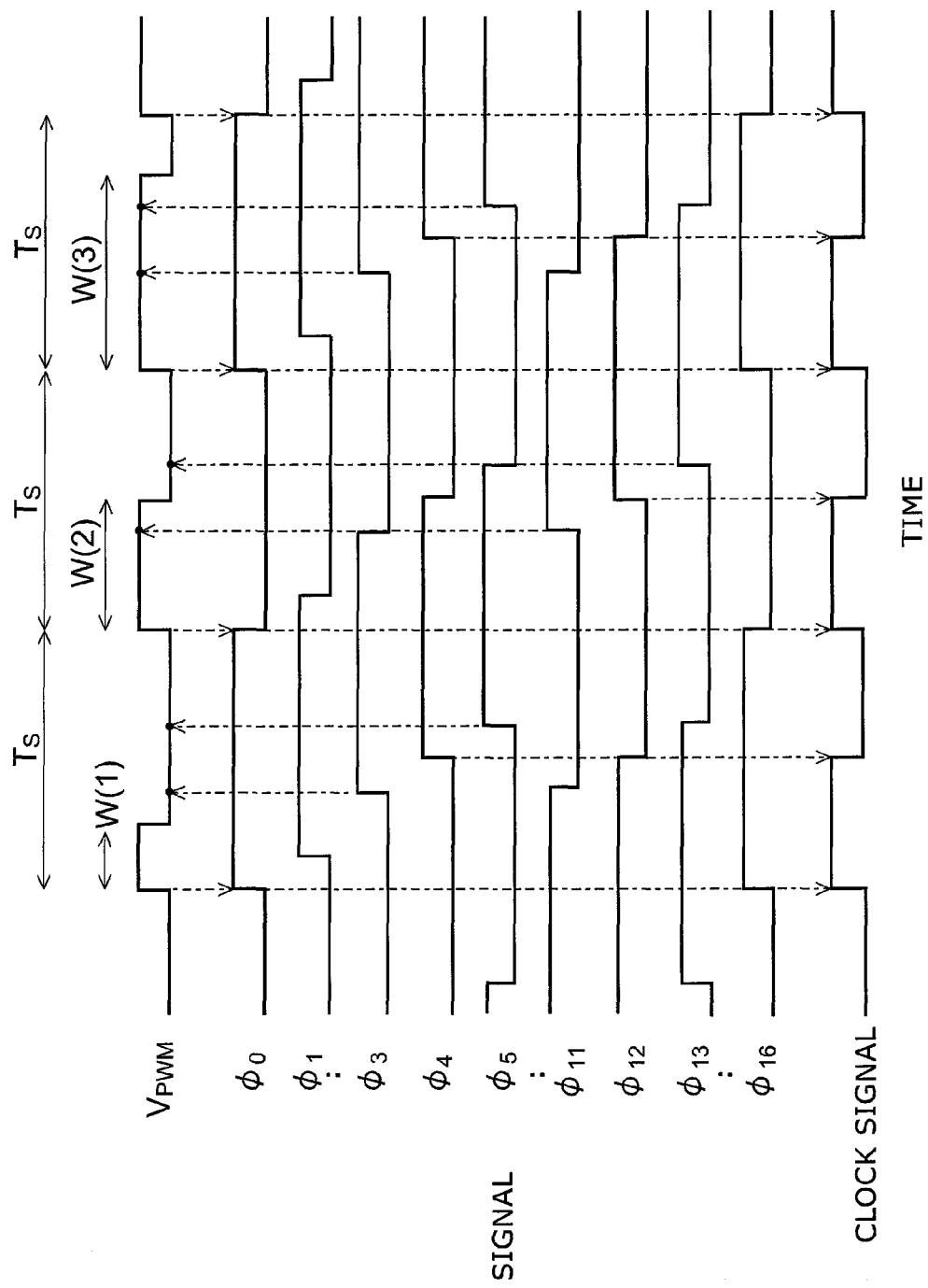
FIG. 6 is a timing chart illustrating the waveforms of the $V_{PWM}$ signal and the $\phi_0$ to $\phi_{16}$ signals.

FIG. 6 is a timing chart illustrating the waveforms of the $V_{PWM}$ signal and the $\phi_0$ to $\phi_{16}$ signals.

Figure 7:
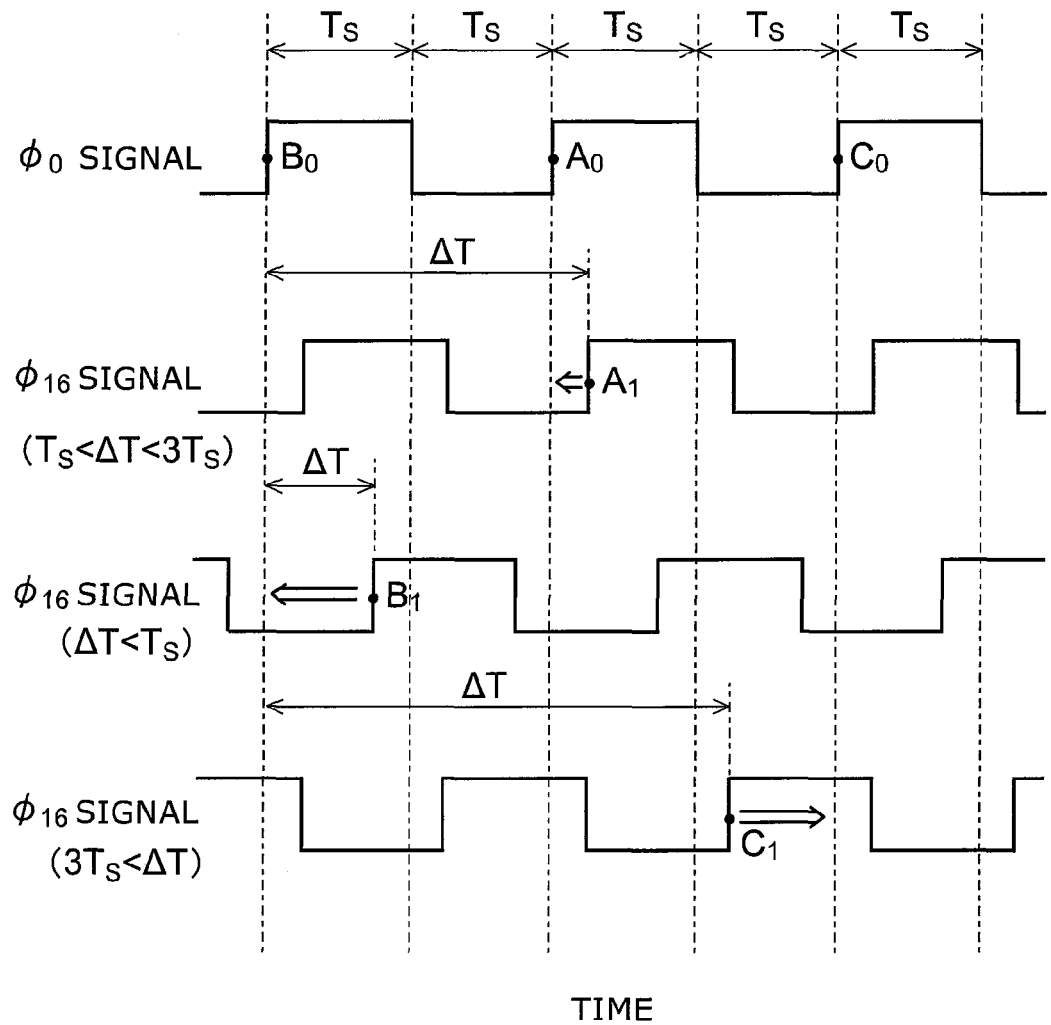
FIG. 7 is a timing chart illustrating effects of the delay amount $\Delta T$ on the operation of the phase comparison circuit.

FIG. 7 is a timing chart illustrating effects of the delay amount $\Delta T$ on the operation of the phase comparison circuit.

Figure 8:
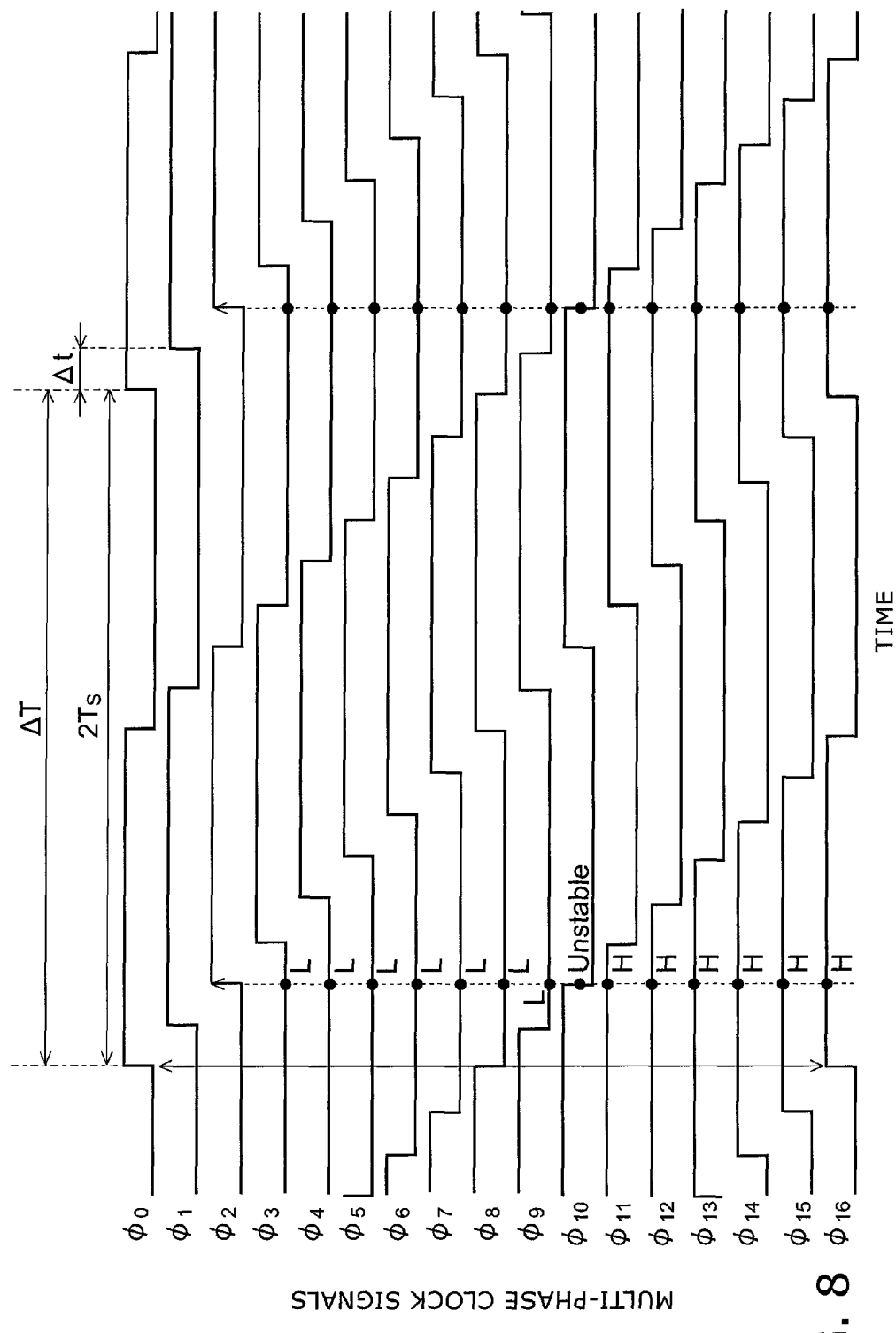
FIG. 8 is a timing chart illustrating the case where the other multi-phase clock signals are latched at the rise of the $\phi_2$ signal.

FIG. 8 is a timing chart illustrating the case where the other multi-phase clock signals are latched at the rise of the $\phi_2$ signal.

FIG. 9 is a table illustrating the relationship between the delay amount $\Delta T$ and the values of the latched signals.

Figures 10A, 10B:
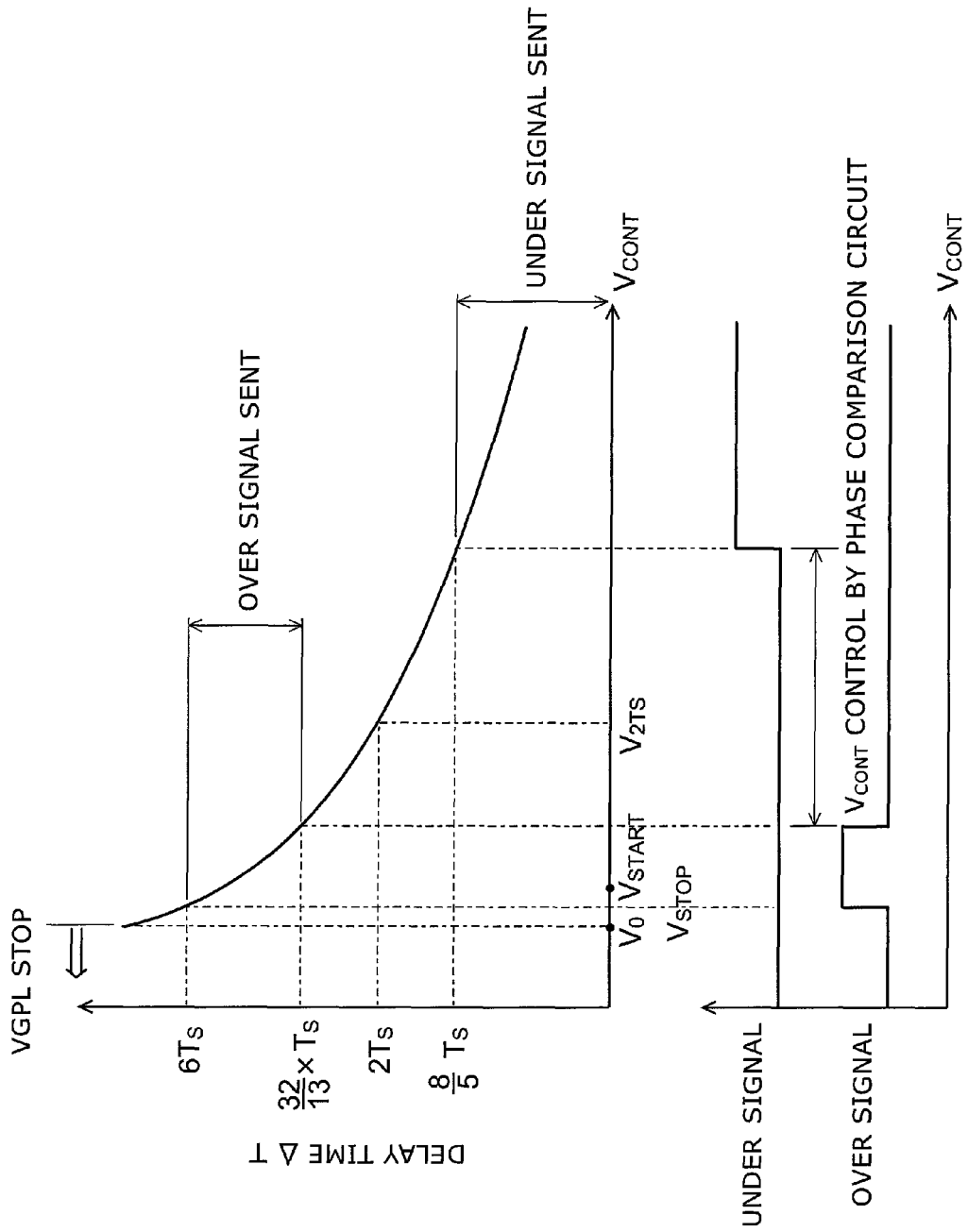
FIG. 10A is a graph illustrating the relationship between the $V_{CONT}$ signal and the delay amount, with the value of the $V_{CONT}$ signal on the horizontal axis and the delay amount $\Delta T$ of the delay circuit on the vertical axis.
FIG. 10B is a graph illustrating the output states of the UNDER signal and the OVER signal, with the value of the $V_{CONT}$ signal on the horizontal axis and the values of the UNDER signal and the OVER signal on the vertical axis.

FIG. 10A is a graph illustrating the relationship between the $V_{CONT}$ signal and the delay amount, with the value of the $V_{CONT}$ signal on the horizontal axis and the delay amount $\Delta T$ of the delay circuit on the vertical axis; and FIG. 10B is a graph illustrating the output states of the UNDER signal and the OVER signal, with the value of the $V_{CONT}$ signal on the horizontal axis and the values of the UNDER signal and the OVER signal on the vertical axis.

FIG. 11 is a truth table of the initial state control circuit illustrated in FIG. 4.

Figures 12A, 12B:
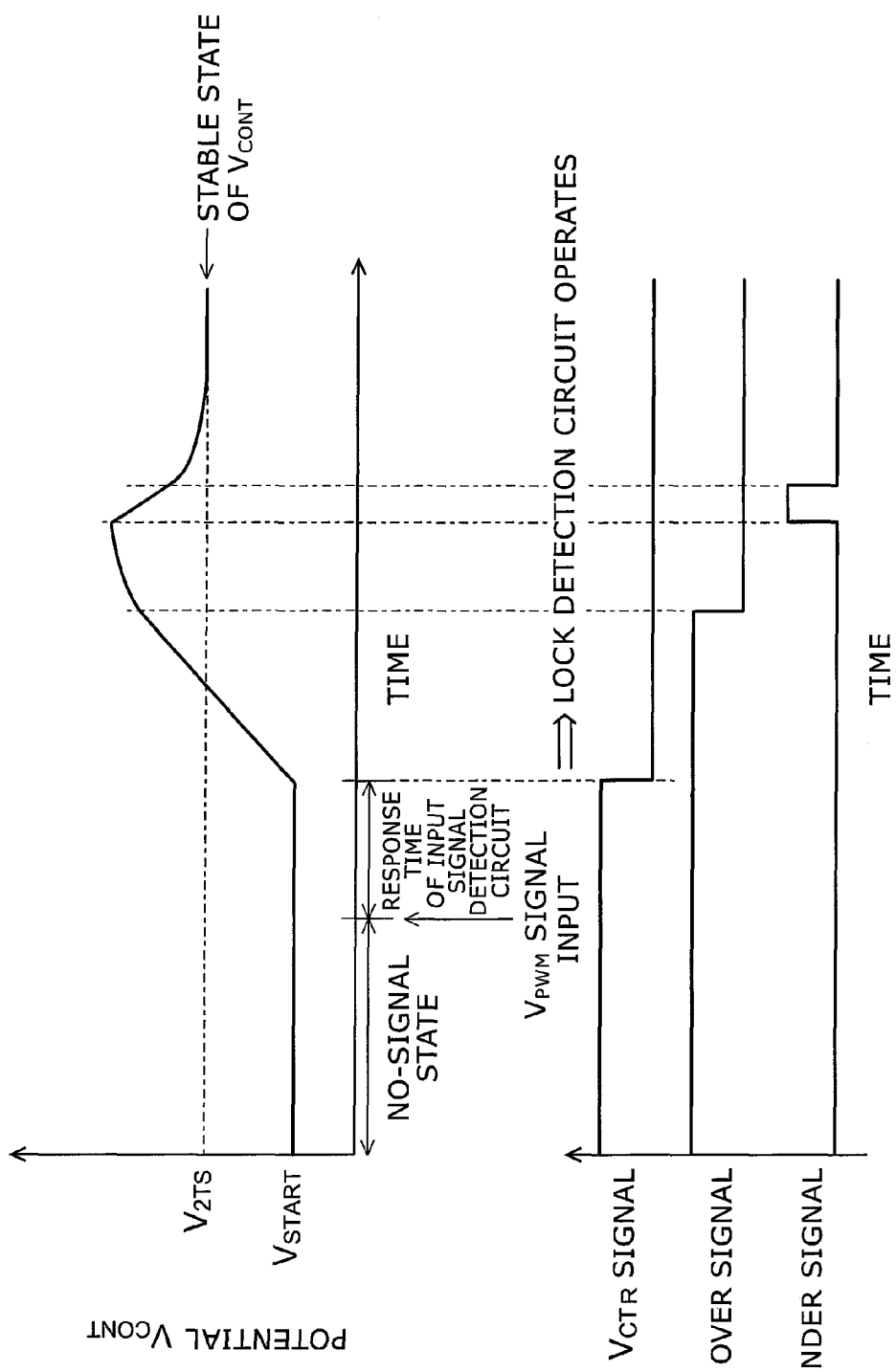
FIG. 12A is a graph illustrating the convergence operation of the $V_{CONT}$ signal, with time on the horizontal axis and the value of the $V_{CONT}$ signal on the vertical axis.
FIG. 12B is a graph illustrating the operation of the lock detection circuit 13, with time on the horizontal axis and the values of the $V_{CTR}$ signal, the OVER signal, and the UNDER signal on the vertical axis.

FIG. 12A is a graph illustrating the convergence operation of the $V_{CONT}$ signal, with time on the horizontal axis and the value of the $V_{CONT}$ signal on the vertical axis; and FIG. 12B is a graph illustrating the operation of the lock detection circuit 13, with time on the horizontal axis and the values of the $V_{CTR}$ signal, the OVER signal, and the UNDER signal on the vertical axis.

First, the operations of the receiving circuit 1 when the $V_{PWM}$ signal is input and the delay amount $\Delta T$ of the entire delay circuit 12 is the prescribed value, that is, when the receiving circuit 1 is in the converging operation state, will be described.

A case will now be described as an example where the $V_{PWM}$ signal is a signal having information of 1.5 bit (hereinbelow, such s signal also is referred to as the "1.5 bit signal".); accordingly, the duty ratio of each of the clocks is one selected from three levels, e.g., 25%, 50%, and 75%; and the number N of stages of the VCDLs 21 is 16.

As illustrated in FIG. 1, the $V_{PWM}$ signal can be input to the clock terminal of the T-type flip-flop 11 of the DLL circuit 6, the lock detection circuit 13, and the demodulation circuit 7. The Q output of the T-type flip-flop 11 inverts when the $V_{PWM}$ signal rises from the L level to the H level. Accordingly, as illustrated in FIG. 6, the $\phi_0$ signal output from the Q terminal of the T-type flip-flop 11 has a period of $2T_S$ and a duty ratio of 50%, and is a binary signal for which the timing of the signal transition is synchronous with the timing of the rise of the $V_{PWM}$ signal. The T-type flip-flop 11 outputs the $\phi_0$ signal to the VCDL 21 of the first stage of the delay circuit 12.

Each of the VCDLs 21 generates an output by delaying the signal that is input by the prescribed delay amount $\Delta t$. Thereby, the VCDL 21 of the first stage generates the $\phi_1$ signal from the $\phi_0$ signal that is input; the VCDL 21 of the second stage generates the $\phi_2$ signal from the $\phi_1$ signal; the VCDL 21 of the ith stage generates the $\phi_i$ signal from the $\phi_{(i-1)}$ signal; and the VCDL 21 of the 16th stage which is the final stage generates the $\phi_{16}$ signal from the $\phi_{15}$ signal. Then, the VCDLs 21 of the third, fourth, fifth, eleventh, twelfth, and thirteenth stages output the $\phi_3$ signal, the $\phi_4$ signal, the $\phi_5$ signal, the $\phi_{11}$ signal, the $\phi_{12}$ signal, and the $\phi_{13}$ signal to the demodulation circuit 7.

The demodulation circuit 7 reads the value of the $V_{PWM}$ signal synchronously with the $\phi_3$ signal, the $\phi_5$ signal, the $\phi_{11}$ signal, and the $\phi_{13}$ signal and reproduces the digital data based on this value. As illustrated in FIG. 6, because the $V_{PWM}$ signal is a 1.5 bit signal and has three types of pulse widths W, it is necessary for the demodulation circuit 7 to read the value at two timing locations per clock of the $V_{PWM}$ signal to discriminate these three types of pulse widths W. Then, because the periods of the multi-phase clock signals are $2T_S$ which corresponds to two periods of the $V_{PWM}$ signal, it is necessary to obtain the value at four timing locations per clock of the multi-phase clock signals.

Therefore, the multi-phase clock signals $\phi_1$ to $\phi_{16}$ having 16 phases are generated from the $\phi_0$ signal; and the multi-phase clock signals of 4 phases are used to read the $V_{PWM}$ signal. In other words, the value of the $V_{PWM}$ signal is read synchronously with the rise of the $\phi_3$ signal, the $\phi_5$ signal, the $\phi_{11}$ signal, and the $\phi_{13}$ signal. Thereby, it is detected whether or not the value of the $V_{PWM}$ signal is the L level or the H level at points in time that are $2T_S \times 3/16 = 0.375T_S$, $2T_S \times 5/16 = 0.625T_S$, $2T_S \times 11/16 = 1.375T_S$, and $2T_S \times 13/16 = 1.625T_S$ after the rise of the $\phi_0$ signal. Thus, the tolerance to fluctuations can be maximized even in the case where the pulse width of the $V_{PWM}$ signal fluctuates in the process of the signal transmission by reading the value at timings that are as distal as possible to the transition point of the $V_{PWM}$ signal; and demodulation errors can be avoided.

The demodulation circuit 7 determines which of the duty ratios of 25%, 50%, and 75% is the duty ratio corresponding to the pulse width W from the value of the $V_{PWM}$ signal that is read at each of the timings. In other words, the pulse width W (odd) of the odd clocks of the $V_{PWM}$ signal is determined from values that are read synchronously with the $\phi_3$ signal and the $\phi_5$ signal; and the pulse width W (even) of the even clocks is determined from values that are read synchronously with the $\phi_{11}$ signal and the $\phi_{13}$ signal. Then, the demodulation circuit 7 restores the digital data based on these values and outputs from the receiving circuit 1. The clock signal is restored based on the $\phi_0$ signal and the $\phi_4$ signal or the $\phi_{12}$ signal. Specifically, a signal that inverts synchronously with the transition point of the $\phi_0$ signal and with the transition point of the $\phi_4$ signal or the $\phi_{12}$ signal is generated and used as the clock signal. Then, the clock signal is output from the demodulation circuit 7.

Thus, in the case where the $V_{PWM}$ signal is the 1.5 bit signal, the multi-phase clock signals of 6 phases, i.e., the $\phi_3$ signal, the $\phi_4$ signal, the $\phi_5$ signal, the $\phi_{11}$ signal, the $\phi_{12}$ signal, and the $\phi_{13}$ signal, are necessary for the demodulation; and the multi-phase clock signals $\phi_1$ to $\phi_{16}$ of at least 16 phases are necessary to minimize the effects of the distortion due to the signal transmission. Accordingly, 16 stages of the VCLDs 21 are necessary in the delay circuit 12. Generally, when the $V_{PWM}$ signal has a bits, the necessary number N of stages of the VCLDs 21 is $N=(2^a+1)\times 4$ in the case where a is a positive integer and $N=(2^{a-0.5}+2)\times 4$ in the case where a is a positive half-integer (1.5, 2.5, etc.). For example, if a=2, then N=20. As described above, if a=1.5, then N=16.

The T-type flip-flop 11 outputs the $\phi_0$ signal to the phase comparison circuit 14; and the VCDL 21 of the final stage of the delay circuit 12 outputs the $\phi_{16}$ signal to the phase comparison circuit 14. The phase comparison circuit 14 detects the phase difference between the $\phi_0$ signal and the $\phi_{16}$ signal and controls the up signal and the down signal (the first control signal) to be output to the charge pump 15 based on this result. For example, the up signal is output in the case where the phase of the $\phi 16$ signal is delayed more than the phase of the $\phi_0$ signal; and the down signal is output in the case where the phase of the $\phi_{16}$ signal is ahead. The charge pump 15 controls the direct-current sources 22 and 23 based on the up signal and the down signal and controls the potential of the $V_{CONT}$ signal (the second control signal) applied to the VCDLs 21. This operation is repeated until the phases of the $\phi_0$ signal and the $\phi_{16}$ signal match each other. Thereby, in the case where the delay amount $\Delta T$ of the entire delay circuit 12 is within the range of $T_S$ to $3T_S$, feedback is provided to the delay amount $\Delta t$ of each of the VCDLs 21; the delay amount $\Delta T$ converges to $2T_S$; and the phase of the $\phi_0$ signal matches the phase of the $\phi_{16}$ signal.

Thus, when a stable $V_{PWM}$ signal is input and the delay amount of the VCDLs 21 is within a constant range, the DLL circuit 6 can supply the multi-phase clock signals to the demodulation circuit 7 by the phase comparison circuit 14 and the charge pump 15 providing feedback to each of the VCDLs 21.

Operations in the case where the delay amount of the VCDLs 21 is greatly shifted will now be described.

In the case where the delay amount $\Delta T$ is shifted by $T_S$ or more from $2T_S$, that is, in the case where the delay amount $\Delta T$ is not more than $T_S$ and in the case where the delay amount $\Delta T$ is not less than $3T_S$, the feedback by the phase comparison circuit 14 described above no longer works well.

In other words, as illustrated in FIG. 7, in the case where the delay amount $\Delta T$ is greater than $T_S$ and less than $3T_S$ ($T_S<\Delta T<3T_S$), the delay amount $\Delta T$ converges to $2T_S$ and the feedback described above works normally because the phase comparison circuit 14 compares the $A_1$ point of the $\phi_{16}$ signal to the $A_0$ point of the $\phi)_0$ signal and causes the timing of the $A_1$ point to match the timing of the $A_0$ point.

However, in the case where the delay amount $\Delta T$ is less than $T_S$ ($\Delta T<T_S$), the delay amount $\Delta T$ converges toward 0 because the phase comparison circuit 14 compares the $B_1$ point of the $\phi_{16}$ signal to the $B_0$ point of the $\phi_0$ signal and causes the timings of the $B_1$ point and the $B_0$ point to match each other. In the case where the delay amount $\Delta T$ is greater than $3T_S$ and less than $5T_S$ ($3T_S<\Delta T<5T_S$), the delay amount $\Delta T$ converges to $4T_S$ because the phase comparison circuit 14 compares the $C_1$ point of the $\phi_{16}$ signal to the $C_0$ point of the $\phi_0$ signal and causes the timings of the $C_1$ point and the $C_0$ point to match each other. Thus, in the case where the delay amount $\Delta T$ is shifted $T_S$ or more from $2T_S$, the timing of the rise of the $\phi_{16}$ signal undesirably converges to the timing of the rise of the $\phi_0$ signal that is most proximal to the timing of the rise of the $\phi_{16}$ signal. Such a phenomenon is called pseudo-lock; and the delay amount $\Delta T$ undesirably converges to an undesired value when pseudo-lock occurs.

Therefore, in the case where the delay amount $\Delta T$ greatly differs from $2T_S$ in the receiving circuit 1, the delay amount $\Delta T$ is forcibly returned to the range of $T_S<\Delta T<3T_S$ by the OVER signal generation circuit 32 sending the OVER* signal or by the UNDER signal generation circuit 33 sending the UNDER signal. Such operations will now be described.

FIG. 8 illustrates the waveforms of the multi-phase clock signals $\phi_0$ to $\phi_{16}$ in the case where the $V_{PWM}$ signal is the 1.5 bit signal, the pulse width accordingly has three levels, the number N of stages of the VCDLs 21 is 16, and the delay amount $\Delta T$ of the entire delay circuit 12 is $2T_S$.

First, as illustrated in FIG. 8, any one signal $\phi_i$, e.g., the $\phi_2$ signal, is selected from the multi-phase clock signals $\phi_0$ to $\phi_{16}$. Then, the values of the other multi-phase clock signals are read at the timing of the rise of the $\phi_2$ signal.

Specifically, the $\phi_2$ signal is input to the clock terminals of the D-type flip-flops 31; all or a portion of the other multi-phase clock signals are input respectively to the D terminals; thereby, these multi-phase clock signals are latched; and the latched signals are output to the OVER signal generation circuit 32, the UNDER signal generation circuit 33, and the initial state control circuit 35. Then, the OVER signal generation circuit 32 determines whether or not the delay amount $\Delta T$ is not less than the OVER threshold; and in the case where the delay amount is not less than the OVER threshold, the OVER signal generation circuit 32 outputs the OVER* signal to the initial state control circuit 35. Thereby, the initial state control circuit 35 outputs the OVER signal to the phase comparison circuit 14. The UNDER signal generation circuit 33 determines whether or not the delay amount $\Delta T$ is not more than the UNDER threshold; and in the case where the delay amount is not more than the UNDER threshold, the UNDER signal generation circuit 33 outputs the UNDER signal to the phase comparison circuit 14.

For example, in the case where the delay amount $\Delta T$ is $2T_S$ as illustrated in FIG. 8, the latched signals of the signals $\phi_3$ to $\phi_9$ are the L level; and the latched signals of the signals $\phi_{11}$ to $\phi_{16}$ are the H level. Because the $\phi_{10}$ signal transitions from the H level to the L level at the same timing as the rise of the $\phi_2$ signal, the value that is latched is unstable. The values of the latched signals of the multi-phase clock signals change dependent on the delay amount $\Delta T$.

Generally, the delay amount $\Delta T$ can be represented by Formula 1 recited below. Here, $\Delta$ is the shift amount from $2T_S/N$ which is the delay amount $\Delta t$ per stage of the VCDLs 21; and the DLL circuit 6 controls the delay amount $\Delta t$ such that $\Delta=0$. Then, in the case where the time difference between the rise point of the $\phi_i$ signal and the transition point of a $\phi_j$ signal is an integer multiple of $T_S$, the latched signal of the $\phi_j$ signal is unstable. This state is represented by Formula 2 recited below. In Formula 2 recited below, m is an integer. The value of the latched signal changes by whether the delay amount $\Delta T$ is greater than or less than that of the state of Formula 2 recited below. Accordingly, by using Formula 2 recited below, the value of the $\phi_j$ signal to be latched synchronously with the $\phi_i$ signal can be known for any value of the delay amount $\Delta T$.

$$\Delta T = N\left(\frac{2T_S}{N} + \Delta\right) = 2T_S + N\Delta \quad \text{[Formula 1]}$$

$$\Delta T = N\left(\frac{2T_S}{N} + \Delta\right) = NT_S\left(\frac{m+1}{j-i}\right) \quad \text{[Formula 2]}$$

FIG. 9 illustrates the delay amount $\Delta T$ calculated using Formula 2 recited above and the values of the latched signals at each of the delay amounts $\Delta T$, where the $\phi_i$ signal that is the reference is the $\phi_2$ signal. For each of the delay amounts $\Delta T$ illustrated in FIG. 9, the value of the latched signal of at least one of the multi-phase clock signals is unstable because the multi-phase clock signal transitions from the L level to the H level or from the H level to the L level. In FIG. 9, "L" represents the latched signal being the L level, "H" represents the latched signal being the H level, and "L/H" represents the latched signal being unstable. The value of the delay amount $\Delta T$ is normalized by $2T_S$.

As illustrated in FIG. 9, the value of the delay amount $\Delta T$ can be determined from the combination of the values of the latched signals of the multi-phase clock signals. However, it is unnecessary to detect the value of the latched signal for all of the multi-phase clock signals $\phi_1$ to $\phi_{16}$ to determine the delay amount $\Delta T$; and it is sufficient to detect the values of the cells enclosed with the bold boxes in FIG. 9. Accordingly, in this example, it is sufficient to provide nine D-type flip-flops 31 and input the $\phi_4$ signal, the $\phi_5$ signal, the $\phi_6$ signal, the $\phi_7$ signal, the $\phi_9$ signal, the $\phi_{10}$ signal, the $\phi_{11}$ signal, the $\phi_{12}$ signal, and the $\phi_{15}$ signal respectively to the D terminals of the nine D-type flip-flops 31.

Then, in the case where at least one selected from the latched signals of the $\phi_5$ signal, the $\phi_7$ signal, the $\phi_{10}$ signal, and the $\phi_{12}$ signal is the L level, the UNDER signal generation circuit 33 determines that the delay amount $\Delta T$ is not more than $4/5 \times 2T_S$ by determining the AND of the latched signals of the $\phi_5$ signal, the $\phi_7$ signal, the $\phi_{10}$ signal, and the $\phi_{12}$ signal and outputs the UNDER signal to the phase comparison circuit 14. In such a case the value $4/5 \times 2T_S$ is used as the UNDER threshold.

On the other hand, in the case where the latched signal of the $\phi_{10}$ signal is the H level and the latched signal of the $\phi_{15}$ signal is the L level, the OVER signal generation circuit 32 can determine that the delay amount $\Delta T$ is greater than $16/13 \times 2T_S \approx 1.2308 \times 2T_S$ and less than $24/13 \times 2T_S \approx 1.8462 \times 2T_S$. In the case where the latched signal of the $\phi_7$ signal is the H level and the latched signal of the $\phi_{11}$ signal is the L level, it can be determined that the delay amount $\Delta T$ is greater than $16/9 \times 2T_S \approx 1.7778 \times 2T_S$ and less than $8/3 \times 2T_S \approx 2.6667 \times 2T_S$. Similarly, the delay amount $\Delta T$ can be determined to be within the prescribed range in the case where the latched signal of the $\phi_4$ signal is the L level and the latched signal of the $\phi_6$ signal is the H level, in the case where the latched signal of the $\phi_5$ signal is the H level and the latched signal of the $\phi_9$ signal is the L level, in the case where the latched signal of the $\phi_5$ signal is the H level and the latched signal of the $\phi_7$ signal is the L level, in the case where the latched signal of the $\phi_5$ signal is the H level and the latched signal of the $\phi_9$ signal is the L level, and in the case where the latched signal of the $\phi_7$ signal is the H level and the latched signal of the $\phi_{11}$ signal is the L level.

Thus, the OVER signal generation circuit 32 can perform the determination in the case where the delay amount $\Delta T$ is within the range not less than $16/13 \times 2T_S$ and not more than $6.0 \times 2T_S$ as illustrated in FIG. 9 by performing a logical operation based on the values of the multiple multi-phase clock signals. Then, in the case where the delay amount $\Delta T$ is within this range, the OVER* signal is output to the initial state control circuit 35. In such a case, the value $16/13 \times 2T_S$ is used as the OVER threshold. The combination of the latched signals that are input to the OVER signal generation circuit 32 is not limited to the example described above; and it is sufficient for the combination to be such that the relationship between the delay amount $\Delta T$ and the OVER threshold can be determined. However, to construct the logic circuit of the initial state control circuit 35 described below, different states of at least two multi-phase clock signals are detected for the generation of the OVER signal. In other words, neither the state in which the states of all of the multi-phase clock signals are the H level nor the state in which the states of all of the multi-phase clock signals are the L level is used.

In the case where the OVER* signal is input to the initial state control circuit 35 as illustrated in FIG. 4, that is, in the case where the OVER* signal is the H level, the output of the OR circuit 54 is the H level and the OVER signal is output to the phase comparison circuit 14. Thereby, the phase comparison circuit 14 controls the charge pump 15 to reduce the delay amount $\Delta t$ of the VCDL 21. For example, the up signal is output; the amount of current of the direct-current source 22 is increased; and the potential of the $V_{CONT}$ signal is increased. On the other hand, in the case where the UNDER signal is input to the phase comparison circuit 14, the phase comparison circuit 14 controls the charge pump 15 to increase the delay amount $\Delta t$ of the VCDL 21. For example, the down signal is output; the amount of current of the direct-current source 23 is increased; and the potential of the $V_{CONT}$ signal is reduced.

By the operations described above as illustrated in FIGS. 10A and 10B, the lock detection circuit 13 returns the delay amount $\Delta T$ to the prescribed range by sending the UNDER signal or the OVER signal to the phase comparison circuit 14 when the delay amount $\Delta T$ is outside the prescribed range. Thereby, even in the case where the delay amount $\Delta T$ is shifted $T_S$ or more from $2T_S$, the pseudo-lock can be avoided and the delay amount $\Delta T$ can be caused to converge to $2T_S$ if the delay amount $\Delta T$ is within the range greater than $0 \times 2T_S$ and not more than $6.0 \times 2T_S$. Herein, the convergable range is referred to as the range greater than $0 \times 2T_S$ and not more than $6.0 \times 2T_S$, i.e., the range made of the range in which the OVER signal generation circuit 32 is operable, the range in which the UNDER signal generation circuit 33 is operable, and the range that is greater than the UNDER threshold and less than the OVER threshold.

Operations in the case where the receiving circuit 1 is in the initial state, that is, in the case where the power supply potential is supplied to the receiving circuit 1 and the receiving circuit 1 is operable but the $V_{PWM}$ signal is not input, will now be described.

In the initial state, the phase comparison circuit 14 does not operate and the potential of the $V_{CONT}$ signal is not controlled because the $V_{PWM}$ signal is not input and the $\phi_0$ signal and the $\phi_{16}$ signal accordingly are not generated. Accordingly, the state of the VCDL 21 also is not controlled.

Therefore, there is no guarantee that the initial value of the delay amount $\Delta T$ will be within the convergable range when the input of the $V_{PWM}$ signal is started; and there are cases where the delay amount $\Delta T$ cannot be caused to converge to $2T_S$ by only the operations described above. For example, in the state in which the potential of the $V_{CONT}$ signal is fixed to be the grounding potential GND, there is a possibility that the initial value of the delay amount $\Delta T$ may undesirably be greater than $6.0 \times 2T_S$. Even in the case where the initial value of the delay amount $\Delta T$ is not more than $6.0 \times 2T_S$, there is a possibility that the lock detection circuit 13 may not operate normally because the Q outputs of the D-type flip-flops 31 may be unstable. Therefore, in the embodiment, the initial state response circuit 30, which is made of the input signal detection circuit 34, the initial state control circuit 35, and the initial state output circuit 36, is provided in the lock detection circuit 13 to respond to the initial state.

As illustrated in FIG. 1 and FIG. 2, the $V_{PWM}$ signal which can be input to the receiving circuit 1 also can be input to the input signal detection circuit 34 of the DLL circuit 6. Operations of the input signal detection circuit 34 will now be described.

First the case where the $V_{PWM}$ signal is input will be described.

As illustrated in FIG. 3, the $V_{PWM}$ signal that is input to the input signal detection circuit 34 is smoothed by the resistance 41 and the capacitor 42. Thereby, the potential of the connection point N2 is a potential corresponding to the average duty ratio of the $V_{PWM}$ signal. The average duty ratio of the $V_{PWM}$ signal depends on the statistical properties of the $V_{PWM}$ signal and is taken to be, for example, 50%. In such a case, if the L level of the $V_{PWM}$ signal is the grounding potential GND and the H level is the power supply potential $V_{DD}$, the potential of the connection point N2 is $\frac{1}{2}V_{DD}$. Accordingly, the output of the upper limit inverter 43 is the H level, the output of the lower limit inverter 44 is the L level, the output of the inverter 45 is the H level, and the output of the NAND circuit 46, i.e., the $V_{CTR}$ signal, is the L level.

The case where the $V_{PWM}$ signal is not input will now be described.

In such a case, the potential of the $V_{PWM}$ signal depends on the operational logic of the receiving circuit 1 and is the power supply potential $V_{DD}$ or the grounding potential GND. Thereby, the potential of the connection point. N2 also is the power supply potential $V_{DD}$ or the grounding potential GND. When the potential of the connection point N2 is the power supply potential $V_{DD}$, the output of the upper limit inverter 43 is the L level, the output of the lower limit inverter 44 is the L level, the output of the inverter 45 is the H level, and the $V_{CTR}$ signal is the H level. When the potential of the connection point N2 is the grounding potential GND as well, the output of the upper limit inverter 43 is the H level, the output of the lower limit inverter 44 is the H level, the output of the inverter 45 is the L level, and the $V_{CTR}$ signal is the H level.

Thus, the input signal detection circuit 34 assumes that the average duty ratio is within the constant range due to the statistical properties of the $V_{PWM}$ signal; and in the case where the average duty ratio is not within the prescribed range, the input signal detection circuit 34 sends the H level $V_{CTR}$ signal. Thereby, when the $V_{PWM}$ signal is input, the $V_{CTR}$ signal is set to the L level; and when the $V_{PWM}$ signal is not input, the $V_{CTR}$ signal is set to the H level.

As illustrated in FIG. 2, the $V_{CTR}$ signal output from the input signal detection circuit 34 is input to the initial state control circuit 35 and the charge pump 15. Thereby, the charge pump 15 stops sending the $V_{CONT}$ signal.

In the initial state control circuit 35 as illustrated in FIG. 4 and FIG. 11, if the $V_{CTR}$ signal is the H level, the $V_{INT}$ signal is the H level and the $V_{INT*}$ signal is the L level regardless of the values of the other signals. The H level $V_{INT}$ signal is output to the initial state output circuit 36.

In the initial state output circuit 36 as illustrated in FIG. 5, the gate potential of the nMOS 72 is determined by the threshold of the nMOS 72. In other words, the gate potential of the nMOS 72 is equal to a gate-source voltage $V_{GS}$ of the nMOS 72; and the voltage $V_{GS}$ is the sum of a-threshold voltage $V_{th}$ and an overdrive voltage $V_{OV}$. When the H level $V_{INT}$ signal is input to the initial state output circuit 36, the pMOS 73 and the nMOS 74 are switched to the on-state, the gate potential of the nMOS 72 is output to each of the VCDLs 21 of the delay circuit 12 as the $V_{CONT}$ signal, and the delay amount $\Delta T$ is set to the initial value. At this time, the potential of the $V_{CONT}$ signal is set to a potential $V_{START}$.

As illustrated in FIG. 10A, the potential $V_{START}$ is a potential such that the delay amount $\Delta T$ is within the convergable range, i.e., one selected from the range in which the OVER signal generation circuit 32 is operable, the range in which the UNDER signal generation circuit 33 is operable, and the range that is greater than the UNDER threshold and less than the OVER threshold, e.g., a potential such that the delay amount $\Delta T$ is within the range in which the OVER signal generation circuit 32 is operable. In other words, the potential $V_{START}$ is a potential to cause the OVER* signal to be sent by the OVER signal generation circuit 32 if the state is the normal state in which the $V_{PWM}$ signal is input. In the example described above, the potential $V_{START}$ is a potential such that the delay amount $\Delta T$ is not less than $16/13 \times 2T_S$ and not more than $6.0 \times 2T_S$. In the case where a potential $V_{STOP}$ is the potential of the $V_{CONT}$ signal to cause the delay amount $\Delta T$ to be $6.0 \times 2T_S$, the lock detection circuit 13 and the phase comparison circuit 14 stop operating when the potential of the $V_{CONT}$ signal is lower than the potential $V_{STOP}$. Therefore, the potential $V_{START}$ that is output from the initial state output circuit 36 is slightly higher than the potential $V_{STOP}$.

Thereby, even if an initial value $V_0$ of the $V_{CONT}$ signal is a low potential such that the delay amount $\Delta T$ is not less than $6.0 \times 2T_S$ as illustrated in FIGS. 10A and 10B, the potential transitions to the potential $V_{START}$ by the operations described above such that the delay amount $\Delta T$ is not more than $6.0 \times 2T_S$.

Further, in the initial state, the Q outputs are unstable because the multi-phase clock signals are not input to the D-type flip-flops 31 (referring to FIG. 2). Therefore, the initial state control circuit 35 outputs the L level $V_{INT*}$ signal to the set terminals of the D-type flip-flops 31. Thereby, the positive phase outputs of the D-type flip-flops 31 (the Q outputs) are set to be the H level; the reverse phase outputs are set to be the L level; and the Q outputs are stabilized.

As a result, in the initial state control circuit 35 as illustrated in FIG. 4, all of the input signals of the NAND circuits 51 and 52, i.e., all of the positive phase outputs (the Q outputs) of the D-type flip-flops 31 into which the $\phi_4$ signal, the $\phi_6$ signal, the $\phi_7$ signal, and the $\phi_{12}$ signal are input to the D terminals, are the H level; and therefore, the outputs of the NAND circuits 51 and 52 are the L level, and the output of the NOR circuit 53 is the H level. Because the OVER* signal is not input at this time, the output of the OR circuit 54 is the H level; and the OVER signal is sent. As illustrated in FIG. 9, when the $V_{PWM}$ signal is input, the $\phi_4$ signal, the $\phi_6$ signal, the $\phi_7$ signal, and the $\phi_{12}$ signal are never simultaneously the H level.

Summarizing the operations hereinabove, in the initial state in which the $V_{PWM}$ signal is not input, the input signal detection circuit 34 generates the H level $V_{CTR}$ signal and outputs the H level $V_{CTR}$ signal to the initial state control circuit 35 and the charge pump 15; and the sending of the $V_{CONT}$ signal (the second control signal) by the charge pump 15 is stopped. On the other hand, the initial state control circuit 35 outputs the H level $V_{INT}$ signal to the initial state output circuit 36; and the initial state output circuit 36 generates the potential $V_{START}$ and outputs the potential $V_{START}$ to the delay circuit 12 as the $V_{CONT}$ signal (the third control signal). Thereby, the supply source of the $V_{CONT}$ signal is switched from the charge pump 15 to the initial state output circuit 36; and the initial value of the delay amount ΔT is set to be not less than $2T_S$ and not more than $6.0\times2T_S$. By the initial state control circuit 35 outputting the L level $V_{INT*}$ signal to the set terminals of the D-type flip-flops 31, all of the positive phase outputs (the Q outputs) of the D-type flip-flops 31 are set to the H level, and the OVER signal is output to the phase comparison circuit 14. Thereby, if the charge pump 15 should operate, the $V_{CONT}$ signal to reduce the delay amount ΔT is output to the delay circuit 12.

The startup operation when the $V_{PWM}$ signal is input for this initial state will now be described.

As illustrated in FIG. 1, when the $V_{PWM}$ signal is input to the receiving circuit 1, the T-type flip-flop 11 generates the $\phi_0$ signal based on the $V_{PWM}$ signal. At this time, because the potential of the $V_{CONT}$ signal is $V_{START}$, the VCDLs 21 can respond immediately; and the $\phi_1$ to $\phi_{16}$ signals are generated from the $\phi_0$ signal and output to the lock detection circuit 13.

As illustrated in FIG. 2, the $V_{PWM}$ signal is input also to the input signal detection circuit 34; and the input signal detection circuit 34 sets the $V_{CTR}$ signal to the L level and releases the initial state after the response time of the input signal detection circuit 34 which is determined by the RC product of the resistance 41 and the capacitor 42. The charge pump 15 starts to operate when the $V_{CTR}$ signal is switched to the L level. The initial state control circuit 35 sets the $V_{INT}$ signal to the L level, switches the pMOS 73 and the nMOS 74 of the initial state output circuit 36 to the off-state, and stops the output of the potential $V_{START}$. Thereby, the supply source of the $V_{CONT}$ signal is switched from the initial state output circuit 36 to the charge pump 15. Further, the initial state control circuit 35 sets the $V_{INT*}$ signal to the H level and releases the set states of the D-type flip-flops 31. Thereby, the Q outputs of the D-type flip-flops 31 are determined based on the delay amount ΔT; and the OVER signal generation circuit 32, the UNDER signal generation circuit 33, and the initial state control circuit 35 operate based on these Q outputs.

By such a series of operations, the DLL circuit 6 transitions from the initial state to the normal state by, for example, behavior such as that illustrated in FIGS. 12A and 12B. Namely, although the $V_{CONT}$ signal is output from the charge pump 15 when the $V_{CTR}$ signal becomes the L level after the $V_{PWM}$ signal is input and after the response time of the input signal detection circuit 34, the charge pump 15 increases the potential of the $V_{CONT}$ signal because the OVER signal is initially output from the initial state control circuit 35 to the phase comparison circuit 14. Subsequently, even when the lock detection circuit 13 operates based on the operations of the T-type flip-flop 11 and the delay circuit 12, the OVER signal generation circuit 32 continues to output the OVER signal because the delay amount ΔT is still not less than the OVER threshold; and the potential of the $V_{CONT}$ signal continues to increase. Thus, the control of the $V_{CONT}$ signal progresses smoothly when transitioning from the initial state to the normal state because the OVER signal is continuously output before and after the $V_{CTR}$ signal transitions from the H level to the L level.

Subsequently, when the delay amount ΔT becomes less than the OVER threshold, the OVER signal is stopped; and the transition to the locking operation by the phase comparison circuit 14 occurs. Namely, the phase comparison circuit 14 controls the $V_{CONT}$ signal such that the phase difference between the $\phi_0$ signal and the $\phi_{16}$ signal becomes zero. In the case where the delay amount ΔT overshoots and becomes the UNDER threshold or less, the UNDER signal generation circuit 33 sends the UNDER signal to forcibly reduce the $V_{CONT}$ signal. Then, when the delay amount ΔT becomes greater than the UNDER threshold, the transition to the locking operation by the phase comparison circuit 14 again occurs. Thus, the delay amount ΔT converges to $2T_S$; and the DLL circuit 6 is synchronized with the $V_{PWM}$ signal.

Operations of the embodiment other than those recited above will now be described.

As illustrated in FIG. 11, if the $V_{CTR}$ signal input from the input signal detection circuit 34 is the H level, the initial state control circuit 35 sets the $V_{INT*}$ signal to the L level regardless of the values of the other signals. This state corresponds to the initial state (the no-signal state). Even in the case where the $V_{CTR}$ signal is the L level and the UNDER signal and the OVER signal are the H level, the $V_{INT*}$ signal is set to the L level. This is because it is considered that the lock detection has become unstable due to effects such as noise, etc., because circumstances in which both the UNDER signal and the OVER signal are the H level are impossible if the $V_{PWM}$ signal is input and the lock detection circuit 13 is operating normally. In such a case, the state of the DLL circuit 6 is returned to the initial state and relocked by the L level $V_{INT*}$ signal being input to the set terminals of the D-type flip-flops 31. Thereby, even in the case where the operation of the lock detection circuit 13 becomes unstable due to noise, etc., the operation can be stabilized by the initial state control circuit 35 setting the D-type flip-flops 31.

If the $V_{CTR}$ signal is the L level and at least one selected from the UNDER signal and the OVER signal is the L level, the $V_{INT*}$ signal is set to the H level. Thereby, the interference of the D-type flip-flops 31 is stopped; and the D-type flip-flops 31 are operated based on the multi-phase clock signals. This state corresponds to one selected from the locked state in which the delay amount ΔT is within the range from the UNDER threshold to the OVER threshold and both the UNDER signal and the OVER signal are the L level, the OVER state in which the delay amount ΔT is not less than the OVER threshold and the OVER signal is the H level, and the UNDER state in which the delay amount ΔT is not more than the UNDER threshold and the UNDER signal is the H level.

Because the VCDLs 21 of the delay circuit 12 include, for example, MOSFETs, there are cases where the threshold voltages of the MOSFETs fluctuate due to factors such as temperature changes, etc. In the case where the threshold voltages fluctuate, the delay amounts of the VCDLs 21 fluctuate even in the case where the $V_{CONT}$ signal is constant. For example, in the case where the threshold voltage increases, the delay amount increases even in the case where the $V_{CONT}$ signal is constant. As a result, the potential $V_{STOP}$ illustrated in FIGS. 10A and 10B increases. In such a case, it is favorable for the potential $V_{START}$ also to increase.

Therefore, in the embodiment as illustrated in FIG. 5, the initial state output circuit 36 generates the potential $V_{START}$ of the $V_{CONT}$ signal in the initial state by the constant current source 71 causing a micro constant current $I_{TAIL}$ to flow between the source and the drain of the nMOS 72. The potential $V_{START}$ depends on the threshold voltage $V_{th}$ of the nMOS 72. In other words, as described above, $V_{START}=V_{GS}=V_{th}+V_{OV}$, where $V_{GS}$ is the gate-source voltage of the nMOS 72, and $V_{OV}$ is the overdrive voltage. Then, the MOSFETs of the VCDLs 21 and the nMOS 72 of the initial state output circuit 36 are provided inside the same DLL circuit 6 and therefore have similar environments. Therefore, in circumstances in which the threshold voltages of the MOSFETs of the VCDLs 21 increase, the threshold voltage of the nMOS 72 also increases; and the potential $V_{START}$ increases as the potential $V_{STOP}$ increases. Thereby, even when the threshold voltages of the MOSFETs change, the potential $V_{START}$ can be reliably higher than the potential $V_{STOP}$.

According to the embodiment, the initial state response circuit 30 which includes the input signal detection circuit 34, the initial state control circuit 35, and the initial state output circuit 36 is provided in the DLL circuit 6. The input signal detection circuit 34 detects the input/non-input of the $V_{PWM}$ signal and sends the $V_{CTR}$ signal to cause the charge pump 15 to stop sending the $V_{CONT}$ signal and cause the initial state output circuit 36 to send the potential $V_{START}$ as the $V_{CONT}$ signal. Thereby, the $V_{CONT}$ signal is pre-controlled in the initial state in which the $V_{PWM}$ signal is not input to prevent the initial value of the delay amount ΔT of the delay circuit 12 from being outside the convergable range when the input of the $V_{PWM}$ signal is started. As a result, the DLL circuit 6 can stably operate when the input of the $V_{PWM}$ signal is started.

In the initial state in the embodiment, the potential $V_{START}$ is set to a potential such that the OVER* signal is sent by the OVER signal generation circuit 32 if the state is the normal state in which the $V_{PWM}$ signal is input. In other words, in the example described above, the potential $V_{START}$ is a potential such that the delay amount ΔT is not less than 16/13×2$T_S$ and not more than 6.0×2$T_S$. The initial state control circuit 35 is caused to send the OVER signal. Thereby, the initial states of the delay circuit 12 and the phase comparison circuit 14 can be set to the appropriate states when the $V_{CTR}$ signal transitions from the H level to the L level and the initial state is released. As a result, the initial operation of the initial state can be controlled.

Although the OVER* signal is sent from the OVER signal generation circuit 32 when the initial state is released and the $V_{CONT}$ signal Is sent from the charge pump 15 because the potential of the $V_{CONT}$ signal is set to the potential $V_{START}$ in the initial state, the OVER signal is already sent from the initial state control circuit 35 in the initial state. Therefore, the OVER signal is continuously sent before and after the transition of the $V_{CTR}$ signal; and the transition from the initial state to the normal state is smooth.

In the embodiment, the VCDLs 21 are configured by utilizing the threshold voltages of MOSFETs; and the potential $V_{START}$ is generated by utilizing the threshold voltage of a MOSFET. Thereby, even in the case where the delay amounts of the VCDLs 21 fluctuate due to temperature changes, etc., the potential $V_{START}$ can change as the delay amount fluctuates. Thereby, misoperations of the DLL circuit 6 can be prevented because the potential $V_{START}$ is not more than the potential $V_{STOP}$ It is not necessary for the margin of the potential $V_{START}$ with respect to the potential $V_{STOP}$ to be excessively large.

In the initial state in the embodiment, the D-type flip-flops 31 can stably operate when the initial state is released because the initial state control circuit 35 outputs the L level $V_{INT*}$ signal to the set terminals of the D-type flip-flops 31. The OVER signal can be output from the initial state control circuit 35 by utilizing the H level positive phase outputs that are output from the D-type flip-flops 31 in the set state.

In the case where the $V_{CTR}$ signal is the L level and both the UNDER signal and the OVER signal are the H level, the initial state control circuit 35 sets the D-type flip-flops 31 by setting the $V_{INT*}$ signal to the L level. Thereby, the state of the DLL circuit 6 can be returned to the initial state and relocked in the case where the operation of the lock detection circuit 13 becomes unstable due to noise, etc. As a result, the DLL circuit 6 that has destabilized for some reason can be returned to the stable operating state.

Although examples are illustrated in the embodiment in which the $V_{PWM}$ signal is a 1.5 bit signal, this is not limited thereto. The bit count of the $V_{PWM}$ signal may be, for example, two bits. The $V_{PWM}$ signal having two bits has four levels of pulse widths having duty ratios of 20%, 40%, 60%, and 80%. Accordingly, it is necessary for the demodulation circuit 7 to read the value of the $V_{PWM}$ signal at six timing locations per clock to determine the pulse width of the $V_{PWM}$ signal. Therefore, 20 stages of the VCDLs 21 are provided in the delay circuit 12; the multi-phase clock signals $\phi_1$ to $\phi 20$ having 20 phases that differ by $2T_S/20$ each are generated; and among these, the multi-phase clock signals $\phi_3, \phi_5, \phi_7, \phi_{13}, \phi_{15}$, and $\phi_{17}$ are output to the demodulation circuit 7. The demodulation circuit 7 demodulates the $V_{PWM}$ signal by using these six types of multi-phase clock signals. Otherwise, the configuration and the operations are basically the same as in the case described above where the $V_{PWM}$ signal is the 1.5 bit signal. However, the combination of the multi-phase clock signals used in the determination of the delay amount ΔT is different from the combination illustrated in FIG. 9. Accordingly, the appropriate combination of the multi-phase clock signals is selected by making a table such as that of FIG. 9 according to the bit count of the $V_{PWM}$ signal.

Other than a photocoupler, the receiving circuit according to the embodiment also is applicable in, for example, a magnetically-coupled transmitter of a digital isolator and an electric field coupled transmitting circuit of a capacitor. Further, the embodiment also is applicable for a general receiving circuit of a PWM modulated signal.

According to the embodiments described above, a lock detection circuit, a DLL circuit, and a receiving circuit that can operate stably in the initial state can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A lock detection circuit mounted in a DLL circuit, the DLL circuit including: a reference clock signal generation circuit configured to generate a reference clock signal from a pulse width modulation signal generated by pulse width modulation of digital data, a period of the reference clock signal being twice a period of the pulse width modulation signal, a phase of the reference clock signal being equal to a phase of the pulse width modulation signal; a delay circuit including a delay line configured to output an input signal after delaying the input signal by a prescribed delay amount, a plurality of stages of the delay lines being connected in series, the reference clock signal being input to the delay line of a first stage; a phase comparison circuit configured to output a first control signal, the reference clock signal and an output signal of the delay line of a final stage being input to the phase comparison circuit; and a charge pump configured to output a second control signal to the delay lines to control the delay amount based on the first control signal, the phase comparison circuit being configured to output the first control signal to reduce the delay amount when an OVER signal is input, output the first control signal to increase the delay amount when an UNDER signal is input, and output the first control signal to match a phase of the output signal of the delay line of the final stage to the phase of the reference clock signal when the OVER signal and the UNDER signal are not input, the DLL circuit being configured to output at least a portion of the output signals of the delay lines, the lock detection circuit comprising:
- an OVER signal generation circuit configured to determine whether or not a delay amount of the entire delay circuit is not less than an OVER threshold based on the output signals of the delay lines and send the OVER signal when the delay amount of the entire delay circuit is not less than the OVER threshold;
- an UNDER signal generation circuit configured determine whether or not the delay amount of the entire delay circuit is not more than an UNDER threshold based on the output signals of the delay lines and send the UNDER signal when the delay amount of the entire delay circuit is not more than the UNDER threshold; and
- an initial state response circuit configured to output a third control signal to the delay lines and cause the charge pump to stop the output of the second control signal when the pulse width modulation signal is not input, the third control signal controlling the delay amount to cause the delay amount of the entire delay circuit to be within one of a range in which the OVER signal generation circuit is operable, a range in which the UNDER signal generation circuit is operable, and a range that is greater than the UNDER threshold and less than the OVER threshold.

2. The lock detection circuit according to claim 1, wherein the initial state response circuit is configured to output the OVER signal to the phase comparison circuit and output the third control signal when the pulse width modulation signal is not input, the third control signal being configured to control the delay amount to cause the delay amount of the entire delay circuit to be within the range in which the OVER signal generation circuit is operable.

3. The lock detection circuit according to claim 1, further comprising a plurality of latch circuits configured to perform latching synchronized with an output signal of one of the delay lines, the latching being performed on output signals of other mutually different delay lines,
- output signals of the latch circuits being input to the OVER signal generation circuit, the UNDER signal generation circuit, and the initial state response circuit,
- the initial state response circuit being configured to fix the outputs of the latch circuits when the pulse width modulation signal is not input.

4. The lock detection circuit according to claim 3, wherein the initial state response circuit is configured to fix the outputs of the latch circuits when the pulse width modulation signal is input and both the OVER signal and the UNDER signal are being sent.

5. The lock detection circuit according to claim 3, wherein:
- the latch circuits are D-type flip-flops having set terminals;
- the output signal of the one of the delay lines is input to clock terminals of the D-type flip-flops;
- the output signals of the other delay lines are input to D terminals of the D-type flip-flops; and
- the initial state response circuit is configured to output a signal to the set terminals when fixing the outputs of the latch circuits.

6. The lock detection circuit according to claim 1, wherein:
- the initial state response circuit includes a first field effect transistor;
- the third control signal is a gate potential of the first field effect transistor when a constant current is caused to flow between a source and a drain of the first field effect transistor; and
- the delay lines include second field effect transistors.

7. A DLL circuit, comprising:
- a reference clock signal generation circuit configured to generate a reference clock signal from a pulse width modulation signal generated by pulse width modulation of digital data, a period of the reference clock signal being twice a period of the pulse width modulation signal, a phase of the reference clock signal being equal to a phase of the pulse width modulation signal;
- a delay circuit including a delay line configured to output an input signal after delaying the input signal by a prescribed delay amount, a plurality of stages of the delay lines being connected in series, the reference clock signal being input to the delay line of a first stage;
- a phase comparison circuit configured to output a first control signal, the reference clock signal and an output signal of the delay line of a final stage being input to the phase comparison circuit;
- a charge pump configured to output a second control signal to the delay lines to control the delay amount based on the first control signal; and
- a lock detection circuit, the pulse width modulation signal and the output signals of the delay lines being input to the lock detection circuit,
- the lock detection circuit including:
  - an OVER signal generation circuit configured to determine whether or not a delay amount of the entire delay circuit is not less than an OVER threshold based on the output signals of the delay lines and send the OVER signal when the delay amount of the entire delay circuit is not less than the OVER threshold;
  - an UNDER signal generation circuit configured to determine whether or not the delay amount of the entire delay circuit is not more than an UNDER threshold based on the output signals of the delay lines and send the UNDER signal when the delay amount of the entire delay circuit is not more than the UNDER threshold; and
  - an initial state response circuit configured to output a third control signal to the delay lines and cause the charge pump to stop the output of the second control signal when the pulse width modulation signal is not input, the third control signal controlling the delay amount to cause the delay amount of the entire delay circuit to be within one of a range in which the OVER signal generation circuit is operable, a range in which the UNDER signal generation circuit is operable, and a range that is greater than the UNDER threshold and less than the OVER threshold,
- the phase comparison circuit being configured to output the first control signal to reduce the delay amount when the OVER signal is input, output the first control signal to increase the delay amount when the UNDER signal is input, and output the first control signal to match a phase of the output signal of the delay line of the final stage to the phase of the reference clock signal when the OVER signal and the UNDER signal are not input,
- the DLL circuit being configured to output at least a portion of the output signals of the delay lines.

8. The DLL circuit according to claim 7, wherein the initial state response circuit is configured to output the OVER signal to the phase comparison circuit and output the third control signal when the pulse width modulation signal is not input, the third control signal being configured to control the delay amount to cause the delay amount of the entire delay circuit to be within the range in which the OVER signal generation circuit is operable.

9. The DLL circuit according to claim 7, wherein:
the lock detection circuit includes a plurality of latch circuits configured to perform latching synchronized with an output signal of one of the delay lines, the latching being performed on output signals of other mutually different delay lines;
output signals of the latch circuits are input to the OVER signal generation circuit, the UNDER signal generation circuit, and the initial state response circuit; and
the initial state response circuit is configured to fix the outputs of the latch circuits when the pulse width modulation signal is not input.

10. The DLL circuit according to claim 9, wherein the initial state response circuit is configured to fix the outputs of the latch circuits when the pulse width modulation signal is input and both the OVER signal and the UNDER signal are being sent.

11. The DLL circuit according to claim 9, wherein:
the latch circuits are D-type flip-flops having set terminals;
the output signal of the one of the delay lines is input to clock terminals of the D-type flip-flops;
the output signals of the other delay lines are input to D terminals of the D-type flip-flops; and
the initial state response circuit is configured to output a signal to the set terminals when fixing the outputs of the latch circuits.

12. The DLL circuit according to claim 7, wherein:
the initial state response circuit includes a first field effect transistor;
the third control signal is a gate potential of the first field effect transistor when a constant current is caused to flow between a source and a drain of the first field effect transistor; and
the delay lines include second field effect transistors.

13. A receiving circuit, comprising:
a DLL circuit; and
a demodulation circuit,
the DLL circuit including:
a reference clock signal generation circuit configured to generate a reference clock signal from a pulse width modulation signal generated by pulse width modulation of digital data, a period of the reference clock signal being twice a period of the pulse width modulation signal, a phase of the reference clock signal being equal to a phase of the pulse width modulation signal;
a delay circuit including a delay line configured to prescribed delay amount, a plurality of stages of the delay lines being connected in series, the reference clock signal being input to the delay line of a first stage;
a phase comparison circuit configured to output a first control signal, the reference clock signal and an output signal of the delay line of a final stage being input to the phase comparison circuit;
a charge pump configured to output a second control signal to the delay lines to control the delay amount based on the first control signal; and
a lock detection circuit, the pulse width modulation signal and the output signals of the delay lines being input to the lock detection circuit,
the lock detection circuit including:
an OVER signal generation circuit configured to determine whether or not a delay amount of the entire delay circuit is not less than an OVER threshold based on the output signals of the delay lines and send the OVER signal when the delay amount of the entire delay circuit is not less than the OVER threshold;
an UNDER signal generation circuit configured to determine whether or not the delay amount of the entire delay circuit is not more than an UNDER threshold based on the output signals of the delay lines and send the UNDER signal when the delay amount of the entire delay circuit is not more than the UNDER threshold; and
an initial state response circuit configured to output a third control signal to the delay lines and cause the charge pump to stop the output of the second control signal when the pulse width modulation signal is not input, the third control signal controlling the delay amount to cause the delay amount of the entire delay circuit to be within one of a range in which the OVER signal generation circuit is operable, a range in which the UNDER signal generation circuit is operable, and a range that is greater than the UNDER threshold and less than the OVER threshold,
the phase comparison circuit being configured to output the first control signal to reduce the delay amount when the OVER signal is input, output the first control signal to increase the delay amount when the UNDER signal is input, and output the first control signal to match a phase of the output signal of the delay line of the final stage to the phase of the reference clock signal when the OVER signal and the UNDER signal are not input,
the DLL circuit being configured to output at least a portion of the output signals of the delay lines,
the demodulation circuit being configured to reproduce the digital data by reading a value of the pulse width modulation signal synchronously with the at least a portion of the output signals of the delay lines.

14. The receiving circuit according to claim 13, wherein the initial state response circuit is configured to output the OVER signal to the phase comparison circuit and output the third control signal when the pulse width modulation signal is not input, the third control signal being configured to control the delay amount to cause the delay amount of the entire delay circuit to be within the range in which the OVER signal generation circuit is operable.

15. The receiving circuit according to claim 13, wherein:
the lock detection circuit includes a plurality of latch circuits configured to perform latching synchronized with an output signal of one of the delay lines, the latching being performed on output signals of other mutually different delay lines;
output signals of the latch circuits are input to the OVER signal generation circuit, the UNDER signal generation circuit, and the initial state response circuit; and
the initial state response circuit is configured to fix the outputs of the latch circuits when the pulse width modulation signal is not input.

16. The receiving circuit according to claim 15, wherein the initial state response circuit is configured to fix the outputs of the latch circuits when the pulse width modulation signal is input and both the OVER signal and the UNDER signal are being sent.

17. The receiving circuit according to claim 15, wherein:
the latch circuits are D-type flip-flops having set terminals;
the output signal of the one of the delay lines is input to clock terminals of the D-type flip-flops;
the output signals of the other delay lines are input to D terminals of the D-type flip-flops; and
the initial state response circuit is configured to output a signal to the set terminals when fixing the outputs of the latch circuits.

18. The receiving circuit according to claim 13, wherein:
the initial state response circuit includes a first field effect transistor;
the third control signal is a gate potential of the first field effect transistor when a constant current is caused to flow between a source and a drain of the first field effect transistor; and
the delay lines include second field effect transistors.

* * * * *